(12) United States Patent
Wang et al.

(10) Patent No.: US 11,889,715 B2
(45) Date of Patent: Jan. 30, 2024

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Benlian Wang, Beijing (CN); Yingsong Xu, Beijing (CN); Weiyun Huang, Beijing (CN); Wen Tan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 33 days.

(21) Appl. No.: 16/979,969

(22) PCT Filed: Oct. 16, 2019

(86) PCT No.: PCT/CN2019/111431
§ 371 (c)(1),
(2) Date: Sep. 11, 2020

(87) PCT Pub. No.: WO2021/072671
PCT Pub. Date: Apr. 22, 2021

(65) Prior Publication Data
US 2021/0257589 A1    Aug. 19, 2021

(51) Int. Cl.
*H10K 50/844*    (2023.01)
*H10K 71/00*    (2023.01)

(52) U.S. Cl.
CPC ........... *H10K 50/844* (2023.02); *H10K 71/00* (2023.02)

(58) Field of Classification Search
CPC ............... G06F 1/1626; H01L 51/5246; H01L 2251/566; H01L 2227/323; H01L 27/3258;
(Continued)

(56) References Cited

U.S. PATENT DOCUMENTS 10,847,546 B2    11/2020   Kwak et al.
2013/0234193 A1*  9/2013   Odnoblyudov ..... H01L 33/0095
                                                        257/99
(Continued)

FOREIGN PATENT DOCUMENTS

CN    105870147 A      8/2016
CN    107808896    *  10/2017   ............. H01K 59/88
(Continued)

OTHER PUBLICATIONS

Translation of CN107808896B (Zhai Yungteng et al) filing date Oct. 27, 2017 . . . (Year: 2017).*
(Continued)

*Primary Examiner* — Jay C Chang
(74) *Attorney, Agent, or Firm* — Dilworth & Barrese, LLP.; Michael J. Musella, Esq.

(57) ABSTRACT

A display substrate and a manufacturing method thereof, and a display device are provided. The display substrate includes a base substrate, a pixel drive layer, a light-emitting device, an encapsulation layer, a first insulation layer, and a covering layer. The base substrate includes a display region and a peripheral region, the peripheral region includes a first peripheral region and a second peripheral region. The first insulation layer is in the second peripheral region, and includes a first notch, a side edge of the first notch away from the display region overlaps with the edge of the base substrate. The covering layer is at least partially filled in the first notch, and an orthographic projection of the covering (Continued)

layer on the base substrate at least partially overlaps with an orthographic projection of the first notch on the base substrate.

18 Claims, 11 Drawing Sheets

(58) Field of Classification Search
CPC ...... H10K 59/88; H10K 59/00; H10K 59/131; H10K 71/00
See application file for complete search history.

(56) References Cited

U.S. PATENT DOCUMENTS

| | | |
|---|---|---|
| 2015/0048329 A1 | 2/2015 | Kim |
| 2016/0233248 A1 | 8/2016 | Kwak et al. |
| 2019/0074460 A1 | 3/2019 | Cai et al. |
| 2019/0165080 A1* | 5/2019 | Ito .................. H10K 59/124 |
| 2019/0165312 A1 | 5/2019 | Bae et al. |
| 2019/0214587 A1* | 7/2019 | Kim .................. H01L 51/5012 |
| 2020/0052002 A1* | 2/2020 | Kwak .................. H01L 51/5246 |
| 2020/0220097 A1 | 7/2020 | Song et al. |
| 2021/0028751 A1* | 1/2021 | Hurwitz .................. H01L 41/313 |

FOREIGN PATENT DOCUMENTS

| | | | |
|---|---|---|---|
| CN | 108281570 A | 7/2018 | |
| CN | 109003998 A | 12/2018 | |
| CN | 109728200 A | 5/2019 | |
| KR | 102489225 * | 12/2017 | ............. H01K 59/88 |
| KR | 20190064254 A | 6/2019 | |
| WO | WO 2005119803 A1 * | 12/2005 | ........... H01L 51/524 |

OTHER PUBLICATIONS

Translation of KR10-2489225 (Minsoo Jang et al.) filing date Dec. 13, 2017. (Year: 2017).*
Extended European Search Report from Application No. 19945464.6 dated Sep. 12, 2022.

* cited by examiner

DISPLAY SUBSTRATE AND MANUFACTURING METHOD THEREOF, AND DISPLAY DEVICE

TECHNICAL FIELD

At least one embodiment of the present disclosure relates to a display substrate and a manufacturing method thereof, and a display device.

BACKGROUND

With the development and progress of society, display equipments are developing towards a direction of having thin body and light weight, and the display equipments are widely used in many fields such as communications, household appliances, advertising, etc. In manufacturing processes of display substrates (such as liquid crystal display (LCD) substrates or organic light-emitting diode (OLED) display substrates, etc.), a large board manufacturing process can be used to form functional structures of multiple display substrates on one mother substrate, and then a plurality of individual display substrates are formed by cutting the mother substrate, afterwards, a subsequent manufacturing process is performed on each individual display substrate.

SUMMARY

At least one embodiment of the present disclosure provides a display substrate, the display substrate comprises a base substrate, a pixel drive layer, a light-emitting device, an encapsulation layer, a first insulation layer, and a covering layer. The base substrate comprises a display region and a peripheral region, the peripheral region surrounds the display region, an edge of the peripheral region away from the display region is identical to an edge of the base substrate, the peripheral region comprises a first peripheral region and a second peripheral region, and the first peripheral region is between the display region and the second peripheral region. The pixel drive layer is on the display region of the base substrate. The light-emitting device is on the pixel drive layer. The encapsulation layer is on the light-emitting device, an orthographic projection of the encapsulation layer on the base substrate covers the display region and the first peripheral region. The first insulation layer is in the second peripheral region, the first insulation layer comprises a first notch at a position of at least a part of the edge of the base substrate, the first notch extends along the edge of the base substrate, and a side edge of the first notch away from the display region overlaps with the edge of the base substrate. The covering layer is in the second peripheral region, the covering layer is at least partially filled in the first notch, and an orthographic projection of the covering layer on the base substrate at least partially overlaps with an orthographic projection of the first notch on the base substrate.

For example, in the display substrate provided by at least one embodiment of the present disclosure, the covering layer further at least partially extends to the first insulation layer outside the first notch, and the orthographic projection of the covering layer on the base substrate further overlaps with an orthographic projection of an edge of the first insulation layer close to the first notch on the base substrate.

For example, in the display substrate provided by at least one embodiment of the present disclosure, a maximum thickness of the covering layer filled in the first notch is greater than a thickness of the first insulation layer.

For example, in the display substrate provided by at least one embodiment of the present disclosure, an outer side edge of the covering layer is basically flush with the edge of the base substrate.

For example, in the display substrate provided by at least one embodiment of the present disclosure, the first insulation layer further comprises at least one second notch, and the at least one second notch is on a side of the first notch close to the display region and at least partially parallel to the first notch, and the first notch and the at least one second notch are provided at intervals.

For example, in the display substrate provided by at least one embodiment of the present disclosure, the at least one second notch comprises a plurality of second notches, and the plurality of second notches extend along a direction parallel to an edge of the base substrate close to the plurality of second notches, and the plurality of second notches are provided at intervals along a direction perpendicular to an extending direction of the plurality of second notches.

For example, in the display substrate provided by at least one embodiment of the present disclosure, widths of the plurality of second notches in the direction perpendicular to the extending direction of the plurality of second notches are identical, and a width of the first notch in a direction perpendicular to an extending direction of the first notch is larger than the widths of the plurality of the second notches.

For example, in the display substrate provided by at least one embodiment of the present disclosure, a depth of the first notch is equal to or less than a thickness of the first insulation layer.

For example, in the display substrate provided by at least one embodiment of the present disclosure, the first notch surrounds the display region of the base substrate.

For example, the display substrate provided by at least one embodiment of the present disclosure further comprises a bonding region on a side of the second peripheral region away from the display region, the first notch is disconnected at the bonding region, and the at least one second notch is disconnected at the bonding region.

For example, in the display substrate provided by at least one embodiment of the present disclosure, the first notch comprises a plurality of first sub-notches provided at intervals along the edge of the base substrate.

For example, in the display substrate provided by at least one embodiment of the present disclosure, the display region comprises an inorganic insulation layer, and the first insulation layer and the inorganic insulation layer are in a same layer and integrally connected.

For example, in the display substrate provided by at least one embodiment of the present disclosure, the display region comprises an inorganic insulation layer, and the first insulation layer comprises a plurality of first insulation sub-layers, and at least one of the plurality of first insulation sub-layers and the inorganic insulation layer are in a same layer and integrally connected.

For example, in the display substrate provided by at least one embodiment of the present disclosure, the inorganic insulation layer comprises a plurality of inorganic insulation sub-layers, and the plurality of first insulation sub-layers and the plurality of inorganic insulation sub-layers are integrally connected in one-to-one correspondence.

For example, in the display substrate provided by at least one embodiment of the present disclosure, the display region further comprises an organic insulation layer, and the covering layer is in a same layer and made of a same material as the organic insulation layer.

For example, in the display substrate provided by at least one embodiment of the present disclosure, the pixel drive layer of the display region comprises a pixel drive circuit and a planarization layer configured to provide a flat surface on a side of the pixel drive circuit away from the base substrate, and the organic insulation layer comprises the planarization layer.

At least one embodiment of the present disclosure provides a display substrate, the display substrate comprises a base substrate, a pixel drive layer, a light-emitting device, an encapsulation layer, a first insulation layer, and a covering layer. The base substrate comprises a display region and a peripheral region, the peripheral region surrounds the display region, an edge of the peripheral region away from the display region is identical to an edge of the base substrate, the peripheral region comprises a first peripheral region and a second peripheral region, and the first peripheral region is between the display region and the second peripheral region. The pixel drive layer is on the display region of the base substrate. The light-emitting device is on the pixel drive layer. The encapsulation layer is on the light-emitting device, an orthographic projection of the encapsulation layer on the base substrate covers the display region and the first peripheral region. The first insulation layer is in the second peripheral region, the first insulation layer comprises a notch only at a position of at least a part of the edge of the base substrate, the notch extends along the edge of the base substrate, and a side edge of the notch away from the display region overlaps with the edge of the base substrate.

For example, in the display substrate provided by at least one embodiment of the present disclosure, a depth of the notch is equal to or less than a thickness of the first insulation layer.

For example, in the display substrate provided by at least one embodiment of the present disclosure, the notch surrounds the display region of the base substrate.

At least one embodiment of the present disclosure provides a display device, the display device comprises the display substrate according to any one of the above embodiments.

At least one embodiment of the present disclosure provides a manufacturing method of a display substrate, the method comprises: providing a base substrate, in which the base substrate comprises a display region and a peripheral region, the peripheral region surrounds the display region, an edge of the peripheral region away from the display region is identical to an edge of the base substrate, the peripheral region comprises a first peripheral region and a second peripheral region, and the first peripheral region is between the display region and the second peripheral region; forming a pixel drive layer on the display region of the base substrate; forming a light-emitting device on the pixel drive layer; forming an encapsulation layer on the light-emitting device, wherein an orthographic projection of the encapsulation layer on the base substrate covers the display region and the first peripheral region; forming a first insulation layer on the second peripheral region of the base substrate, wherein the first insulation layer comprises a first notch at a position of at least a part of the edge of the base substrate, a length direction of the first notch extends along the edge of the base substrate; forming a covering layer on the second peripheral region of the base substrate, wherein the covering layer is at least partially filled in the first notch; and cutting the base substrate to obtain an independent display substrate, wherein a cutting line of the cutting passes through the first notch, so that in the independent display substrate, a side edge of the first notch away from the display region overlaps with the edge of the base substrate.

For example, in the manufacturing method of the display substrate provided by at least one embodiment of the present disclosure, forming the first insulation layer comprises: coating a first insulation material layer on the base substrate; and performing a patterning process on the first insulation material layer to form the first insulation layer comprising the first notch.

For example, in the manufacturing method of the display substrate provided by at least one embodiment of the present disclosure, performing the patterning process on the first insulation material layer comprises: coating a photoresist film on the first insulation material layer; exposing and developing the photoresist film to form a photoresist pattern, wherein the photoresist pattern exposes at least a part of the side edge of the first insulation layer; and etching a portion, which is exposed, of the first insulation material layer to form the first notch.

For example, the manufacturing method of the display substrate provided by at least one embodiment of the present disclosure further comprises: forming an inorganic insulation layer in the display region, wherein the first insulation layer is formed in a same layer as the inorganic insulation layer.

For example, the manufacturing method of the display substrate provided by at least one embodiment of the present disclosure further comprises: forming an organic insulation layer in the display region, wherein the covering layer is formed in a same layer as the organic insulation layer.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
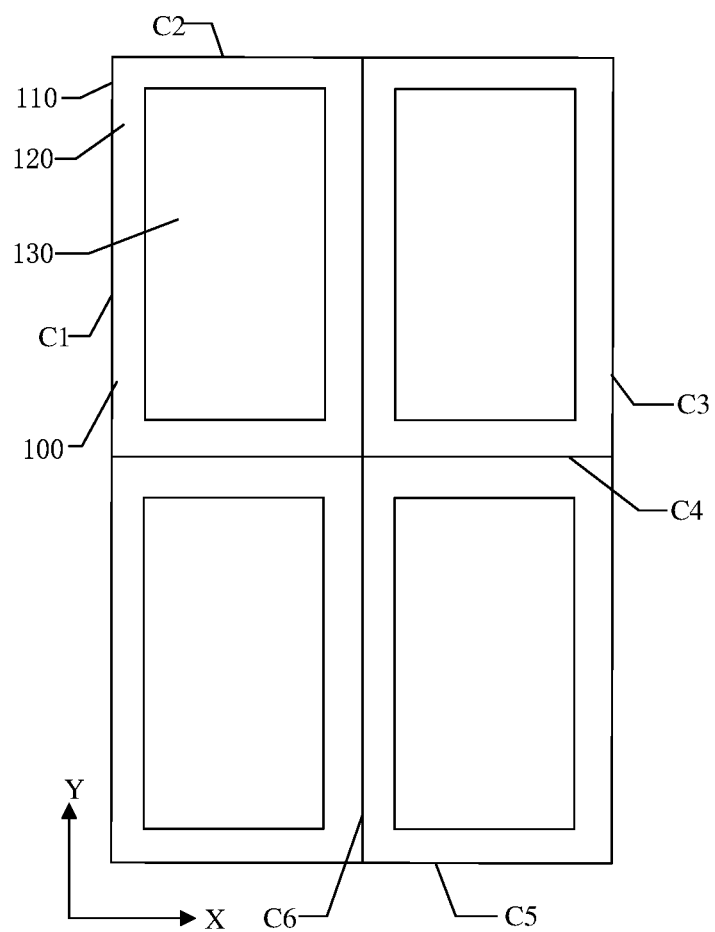
FIG. 1 is a schematic top view of a mother substrate of a display substrate.

For example, FIG. 1 is a schematic top view of a mother substrate of a display substrate. As shown in FIG. 1, a mother substrate 100 is used to form a plurality of display substrates 110 (four display substrates 110 are shown in the figure), and each of the plurality of display substrates 110 includes a display region 130 and a peripheral region 120. After a plurality of functional structures of the plurality of display substrates 110 (such as pixel drive circuits and light-emitting devices, etc.) are manufactured on the mother substrate 100, the mother substrate 100 can be cut along a cutting line C1, a cutting line C2, a cutting line C3, a cutting line C4, a cutting line C5, and a cutting line C6 by a cutting method such as a guide wheel cutting method or a laser cutting method, thereby forming a plurality of individual display substrates 110. However, in the case where the mother substrate 100 is cut, cutting cracks are easily generated on functional structures (such as an inorganic material layer, etc.) at the cutting lines of the mother substrate 100, and these cutting cracks may extend to the display region 130 of the display substrate 110. If these cutting cracks cause sealing failure, the display substrate will fail, or the durability of the display substrate is affected.

At least one embodiment of the present disclosure provides a display substrate and a manufacturing method thereof, and a display device. The display substrate includes a base substrate, a pixel drive layer, a light-emitting device, an encapsulation layer, a first insulation layer, and a covering layer. The base substrate includes a display region and a peripheral region, the peripheral region surrounds the display region, an edge of the peripheral region away from the display region is identical to an edge of the base substrate, the peripheral region includes a first peripheral region and a second peripheral region, and the first peripheral region is located between the display region and the second peripheral region. The pixel drive layer is provided on the display region of the base substrate. The light-emitting device is provided on the pixel drive layer. The encapsulation layer is provided on the light-emitting device, and an orthographic projection of the encapsulation layer on the base substrate covers the display region and the first peripheral region. The first insulation layer is located in the second peripheral region, the first insulation layer includes a first notch at a position of at least a part of the edge of the base substrate, the first notch extends along the edge of the base substrate, and a side edge of the first notch away from the display region overlaps with the edge of the base substrate. The covering layer is located in the second peripheral region, the covering layer is at least partially filled in the first notch, and an orthographic projection of the covering layer on the base substrate at least partially overlaps with an orthographic projection of the first notch on the base substrate.

In the above-mentioned display substrate, the first insulation layer located in the second peripheral region of the display substrate is provided with a first notch at a position of at least a part of the edge of the base substrate, and a covering layer is provided on the first notch, so that in the case where the edge of the display substrate is cut, for example, in the case where a separate display substrate is formed by cutting the mother substrate, cutting lines pass through the first notch, the first notch can prevent the edge that is cut from generating cracks or can block the propagation of cracks so as to prevent cracks from extending to the display region of the display substrate. Further, the covering layer on the first notch can further improve the impact resistance of the display substrate to external forces at the edge, thereby further preventing cracks from extending to the second peripheral region and the display region. In addition, the covering layer can also prevent the warpage phenomenon at the edge of the base substrate and ensure the quality of the display substrate.

Next, the display substrate and the manufacturing method thereof, and the display device provided by embodiments of the present disclosure will be described with reference to the accompanying drawings.

It should be noted that, in each accompanying drawing of the present disclosure, for clarity of description, a spatial rectangular coordinate system is established based on a base substrate of the display substrate to explain the position of each structure in the display substrate. In the spatial rectangular coordinate system, an X axis and a Y axis are parallel to the plane where the base substrate is located, and a Z axis is perpendicular to the plane where the base substrate is located.

Figure 2:
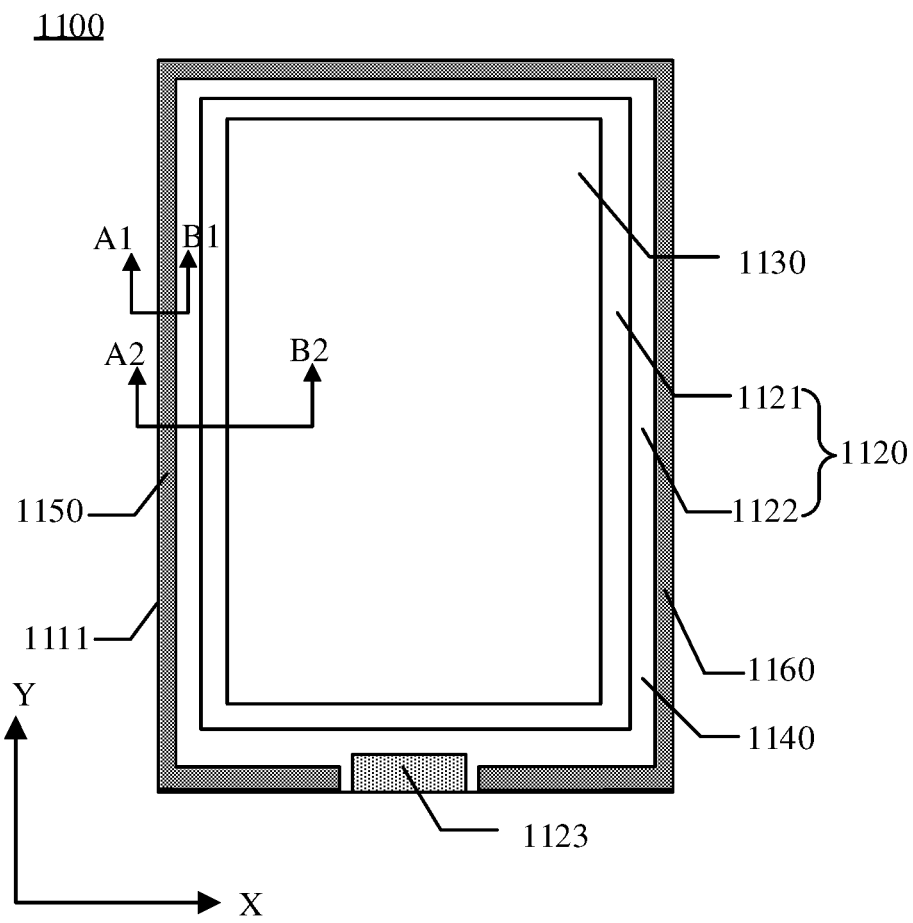
FIG. 2 is a schematic top view of a display substrate according to at least one embodiment of the present disclosure.
Figure 3A:
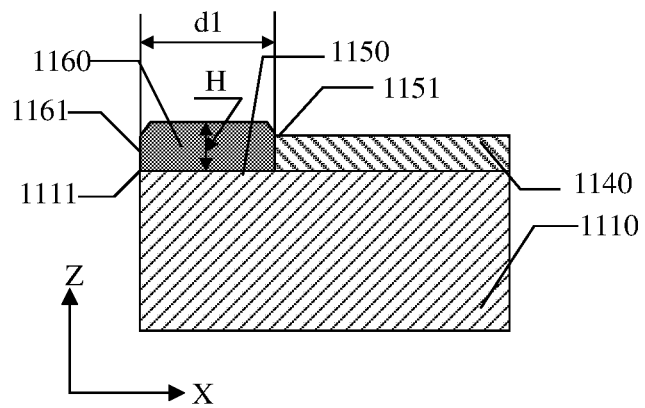
FIG. 3A is a schematic cross-sectional view of the display substrate as shown in FIG. 2 along a line A1-B1.
Figure 4:
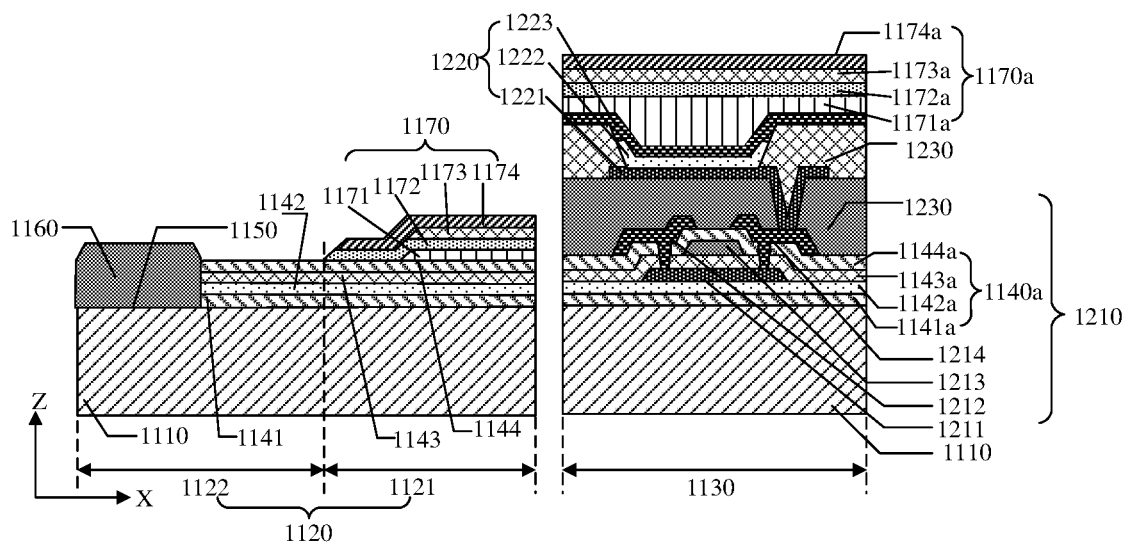
FIG. 4 is a schematic cross-sectional view of the display substrate as shown in FIG. 2 along a line A2-B2.

At least one embodiment of the present disclosure provides a display substrate. FIG. 2 is a schematic top view of a display substrate according to at least one embodiment of the present disclosure. FIG. 3A is a schematic cross-sectional view of the display substrate as shown in FIG. 2 along a line A1-B1. FIG. 4 is a schematic cross-sectional view of the display substrate as shown in FIG. 2 along a line A2-B2.

As shown in FIG. 2 and FIG. 4, the display substrate 1100 includes a base substrate 1110, and the base substrate 1110 includes a display region 1130 and a peripheral region 1120. The peripheral region 1120 surrounds the display region 1130, and an edge of the peripheral region 1120 away from the display region 1130 is the same as an edge 1111 of the base substrate, that is the edge of the peripheral region 1120 away from the display region 1130 is the edge 1111 of the base substrate. The peripheral region 1120 includes a first peripheral region 1121 and a second peripheral region 1122. The first peripheral region 1121 is located between the second peripheral region 1122 and the display region 1130. For example, the first peripheral region 1121 and the display region 1130 are the encapsulation region of the display substrate 1100 together. As shown in FIG. 4, the display substrate 1100 further includes a pixel drive layer 1210, a light-emitting device 1220, and an encapsulation layer that are formed on the base substrate 1110. For example, the encapsulation layer forms an encapsulation for the display substrate 1100 in the first peripheral region 1121 and the display region 1130.

For example, as shown in FIG. 4, the pixel drive layer 1210 is arranged on the display region 1130 of the base substrate 1110, and the light-emitting device 1220 is arranged on the pixel drive layer 1210. The encapsulation layer is arranged on the light-emitting device 1220, and the encapsulation layer includes a first encapsulation layer 1170a located in the display region 1130 and a second encapsulation layer 1170 located in the first peripheral region 1121. For example, the first encapsulation layer 1170a and the second encapsulation layer 1170 may be an integral structure, so that the first encapsulation layer 1170a and the second encapsulation layer 1170 can be integrally formed in a manufacturing process. The orthographic projection of the encapsulation layer on the base substrate 1110 covers the display region 1130 and the first peripheral region 1121, so as to form an encapsulation for the display substrate 1100 in the first peripheral region 1121 and the display region 1130, thereby providing protection and sealing.

As shown in FIG. 2 and FIG. 3A, the display substrate 1100 further includes a first insulation layer 1140 located in the second peripheral region 1122, and the first insulation layer 1140 includes a first notch 1150 at the position of at least a part of the edge 1111 of the base substrate 1110. The first notch 1150 is located in the second peripheral region 1120. The first notch 1150 extends along the edge 1111 of the base substrate 1110, and a side of the first notch 1150 away from the display region 1130 overlaps with the edge 1111 of the base substrate. In this case, the first notch 1150 exposes the at least a part of the edge 1111 of the base substrate 1110. Therefore, in the case where the display substrate 1100 is formed by cutting the mother substrate, the cutting line passes through the first notch 1150 and the first insulation layer 1140 is not cut at the first notch 1150, so that cracks caused by cutting the first insulation layer 1140 can be avoided.

For example, in some embodiments, the first notch 1150 surrounds the display region of the base substrate 1110, so that the first notch 1150 can provide crack protection around the display substrate 1100.

For example, in some embodiments, as shown in FIG. 2, the display substrate 1100 further includes a bonding region 1123 located on a side of the second peripheral region 1122 away from the display region 1130. For example, the bonding region includes a fan-out region and a welding region, and the welding region is located on a side of the fan-out region away from the display region of the base substrate. Data lead lines in the fan-out region extend to the display region to be connected with signal lines in the display region, and the welding region is used for welding external circuits or chips to the bonding region through a bonding process. One end of the bonding region 1123 is electrically connected with a plurality of signal lines in the display region 1130, and the other end is bonded to an external drive element such as an external circuit board or a drive chip, thereby electrically connecting the display region 1130 with the external drive element. In this case, the first notch 1150 is disconnected at the bonding region 1123 for circuit arrangement.

For example, as shown in FIG. 3A, the depth of the first notch 1150 may be equal to the thickness of the first insulation layer 1140, and the thickness of the first insulation layer 1140 is the distance from the surface of the first insulation layer 1140 away from the base substrate 1110 to the base substrate 1110. In this case, the first notch 1150 is formed by completely removing the first insulation layer 1140 at the corresponding position. The width d1 of the first notch 1150 in a direction perpendicular to an extending direction of the first cutout 1150 (that is, in a direction perpendicular to the side edge of the display substrate, the distance between the side edge 1151 of the first notch and the edge 1111 of the base substrate), for example, may be selected to be about 100 microns, but the embodiments of the present disclosure are not limited thereto.

It should be noted that, in the embodiments of the present disclosure, "about" means that the range of a value can vary within 5% of a selected value.

For example, the distance between the side edge 1151 of the first notch and the display region 1130 may be determined according to the width of the peripheral region of the display substrate, for example, may be about 1 mm, and the embodiments of the present disclosure are not limited thereto. The first notch can prevent cracks from being generated on the edge of the display substrate or block the spreading of the cracks generated on the edge of the display substrate, thereby reducing the possibility of the cracks extending to the second peripheral region and the display region.

For example, the material of the first insulation layer 1140 may include inorganic insulation materials such as silicon oxide, silicon nitride, silicon oxynitride, etc. The embodiments of the present disclosure do not specifically limit the material of the first insulation layer 1140.

For example, as shown in FIG. 2 and FIG. 3A, a covering layer 1160 is located in the second peripheral region 1122 and filled in the first notch 1150, and an orthographic projection of the covering layer 1160 on the base substrate 1110 overlaps with the orthographic projection of the first notch 1150 on the base substrate 1110, for example, the figure shows that the orthographic projection of the covering layer 1160 on the base substrate 1110 completely overlaps with the orthographic projection of the first notch 1150 on the base substrate 1110. The covering layer can form a crack barrier dam, which can further improve the impact resistance of the display substrate to external forces at the edge, thereby further preventing cracks from extending to the second peripheral region and the display region. In addition, the covering layer can also prevent the warpage phenomenon at the edge of the base substrate.

For example, the outer side edge of the covering layer is basically flush with the edge of the base substrate. As shown in FIG. 3A, the outer side edge 1161 of the covering layer 1160 is flush with the edge 1111 of the base substrate 1110, that is, the outer side edge 1161 and the edge 1111 are located on the same plane. Therefore, the warpage phenomenon is avoided at the edge of the base substrate. For example, the material of the covering layer may include organic materials, the organic materials include organic polymer resin materials, organic polymer materials, etc., such as polyimide (PI), polymethylmethacrylate, polystyrene (PS), or aromatic, propylene-based polymers, phthalimide-based polymers, aryl ether-based polymers, amino polymers, fluorine-based polymers, para-xylene-based polymers, vinyl alcohol-based polymers or their combinations. The embodiments of the present disclosure do not limit the specific material of the covering layer.

For example, in some examples, the orthographic projection of the covering layer 1160 on the base substrate 1110 may partially overlap with the orthographic projection of the first notch 1150 on the base substrate 1110, that is, the covering layer 1160 is partially filled in the first notch 1150. The embodiments of that present disclosure are not limited thereto.

For example, in some examples, the covering layer further at least partially extends to the first insulation layer outside the first notch, and the orthographic projection of the covering layer on the base substrate further overlaps with the orthographic projection of an edge of the first insulation layer close to the first notch on the base substrate.

Figure 3B:
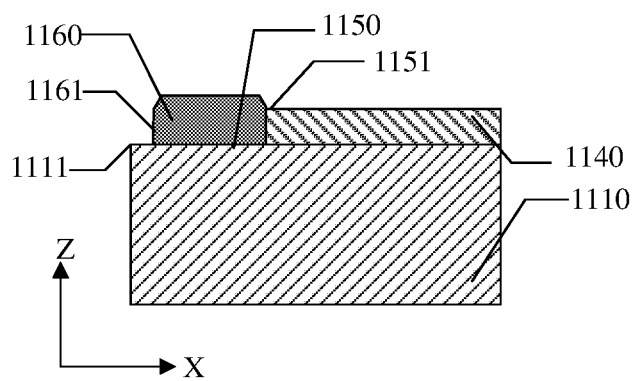
FIG. 3B is another schematic cross-sectional view of the display substrate as shown in FIG. 2 along the line A1-B1.

For example, as shown in FIG. 3B, the outer side edge 1161 of the covering layer 1160 is not flush with the edge 1111 of the base substrate 1110, and the outer side edge 1161 of the covering layer 1160 is closer to the display region 1130 of the base substrate 1110 than the edge 1111 of the base substrate 1110. The orthographic projection of the covering layer 1160 on the base substrate 1110 partially overlaps with the orthographic projection of the first notch 1150 on the base substrate 1110.

Figure 3C:
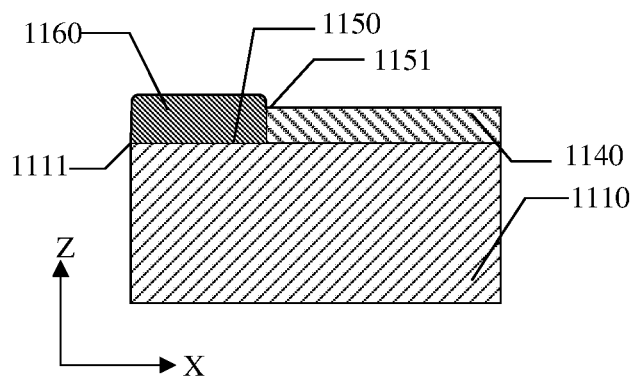
FIG. 3C is another schematic cross-sectional view of the display substrate as shown in FIG. 2 along the line A1-B1.
Figure 3D:
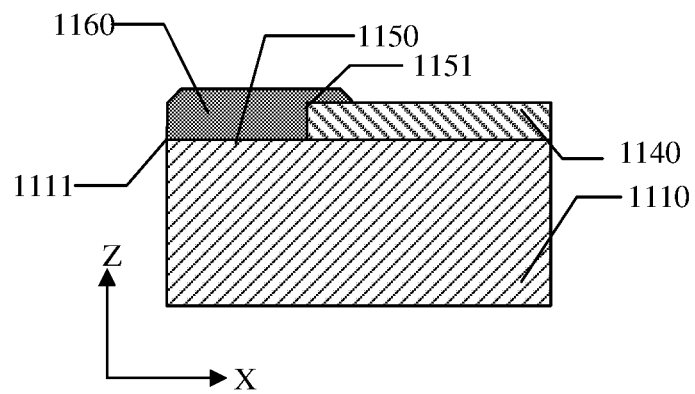
FIG. 3D is another schematic cross-sectional view of the display substrate as shown in FIG. 2 along the line A1-B1.

For example, FIG. 3D is another schematic cross-sectional view of the display substrate as shown in FIG. 2 along the line A1-B1. As shown in FIG. 3D, The covering layer 1160 covers the first notch 1150 and the first insulation layer 1140 outside the side edge 1151 of the first notch 1150. In this case, the edge of the covering layer 1160 close to the display region 1130 overlaps with the edge of the first insulation layer 1140 close to the first notch 1150. In this way, the covering layer can more effectively improve the impact resistance of the display substrate to external forces at the edge, thereby further preventing the cracks from extending to the second peripheral region and the display region.

For example, as shown in FIG. 3A, FIG. 3B, and FIG. 3D, the edge of the covering layer 1160 includes a smooth inclined edge. The edge of the covering layer 1160 may also include a smooth arc edge as shown in FIG. 3C. Embodiments of the present disclosure are not limited to these cases.

For example, in some examples, the smooth inclined edge or the smooth curved edge included in the edge of the covering layer 1160 is caused by the manufacturing process of the covering layer 1160, so that the thickness of the covering layer 1160 at the edge is not equal to the thickness of the covering layer 1160 except the edge of the covering layer 1160. Generally, the thickness of the covering layer 1160 at the edge is smaller than the thickness of the covering layer 1160 except the edge of the covering layer 1160. In some cases, the thickness of the covering layer 1160 at an outermost edge may be zero. It should be noted that the thickness of the covering layer here refers to the height of the upper surface of the covering layer in the direction away from the base substrate.

For example, in some examples, the maximum thickness of the covering layer is greater than the thickness of the first insulation layer. As shown in FIG. 3A, the maximum thickness H of the covering layer 1160 is located at a position of the covering layer away from the edge of the covering layer, and the maximum thickness H is greater than the thickness of the first insulation layer 1140. That is, relative to the surface of the base substrate 1110, the height of the upper surface of the cover layer 1160 (for example, at the position marked with the maximum thickness H in the figure) in the direction away from the base substrate 1110 is greater than the height of the upper surface of the first insulation layer 1140 in the second peripheral region 1122 in the direction away from the base substrate 1110. In this way, the covering layer can increase the structural strength of the display substrate, thereby more effectively improving the impact resistance of the display substrate to external forces at the edge, and preventing cracks from extending to the second peripheral region and the display region.

Figure 3E:
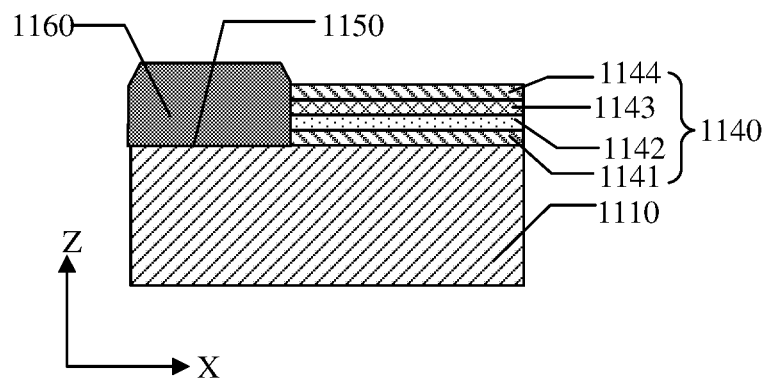
FIG. 3E is another schematic cross-sectional view of the display substrate as shown in FIG. 2 along the line A1-B1.

For example, in some examples, the first insulation layer includes a plurality of first insulation sub-layers. As shown in FIG. 3E, the first insulation layer 1140 includes a barrier layer 1141, a buffer layer 1142, a gate insulation layer 1143, and an interlayer insulation layer 1144 that are sequentially arranged on the base substrate 1110. In the example as shown in FIG. 3E, the first notch 1150 is formed by completely removing materials of the barrier layer 1141, the buffer layer 1142, the gate insulation layer 1143, and the interlayer insulation layer 1144 at the corresponding position. In this case, the depth of the first notch 1150 is equal to the thickness of the first insulation layer 1140.

For example, materials of one or more of the barrier layer 1141, the buffer layer 1142, the gate insulation layer 1143, and the interlayer insulation layer 1144 may include inorganic insulation materials such as silicon oxide, silicon nitride, and silicon oxynitride, etc., and the materials of the barrier layer 1141, the buffer layer 1142, the gate insulation layer 1143, and the interlayer insulation layer 1144 may be the same or different.

Figure 3F:
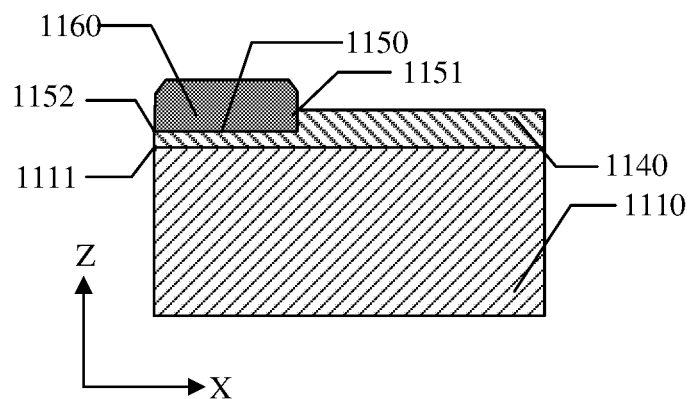
FIG. 3F is another schematic cross-sectional view of the display substrate as shown in FIG. 2 along the line A1-B1.
Figure 3G:
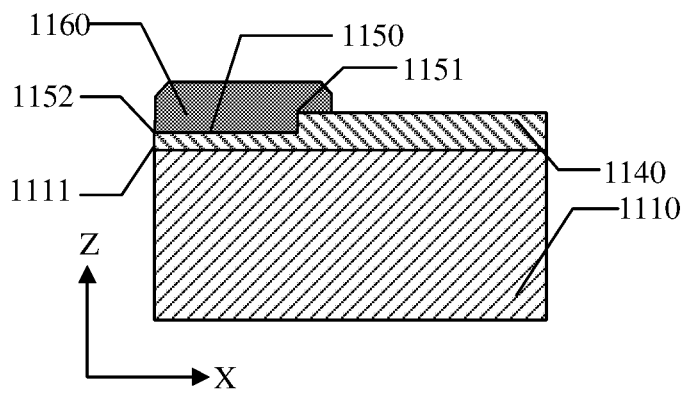
FIG. 3G is another schematic cross-sectional view of the display substrate as shown in FIG. 2 along the line A1-B1.

For example, in some examples, the depth of the notch may also be less than the thickness of the first insulation layer. As shown in FIG. 3F and FIG. 3G, the first notch 1150 is formed by removing a part of the first insulation layer 1140 at the corresponding position. In this case, the first insulation layer 1140 at the edge of the base substrate 1110 is in a stepped shape, and the edge 1152 of the first insulation layer 1140 away from the display region 1130 overlaps with the edge 1111 of the base substrate 1100.

For example, as shown in FIG. 3F, the covering layer 1160 at least partially covers the first notch 1150, and the figure shows that the covering layer 1160 completely covers the first notch 1150, or as shown in FIG. 3G, the covering layer 1160 covers the first notch 1150 and the edge of the first insulation layer 1140 that is outside the side edge 1151 of the first notch 1150 and close to the first notch 1150.

Figure 3H:
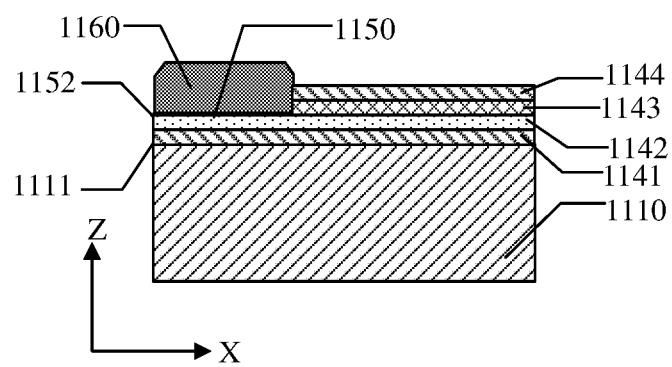
FIG. 3H is another schematic cross-sectional view of the display substrate as shown in FIG. 2 along the line A1-B1.

For example, in some examples, in the case where the first insulation layer 1140 includes the barrier layer 1141, the buffer layer 1142, the gate insulation layer 1143, and the interlayer insulation layer 1144 that are sequentially arranged on the base substrate 1110, the first notch 1150 may also be formed by partially removing the first insulation layer 1140. For example, as shown in FIG. 3H, the first notch 1150 is formed by removing the gate insulation layer 1143 and the interlayer insulation layer 1144, so that the depth of the first notch 1150 is equal to the sum of the thickness of the gate insulation layer 1143 and the thickness of the interlayer insulation layer 1144, and there is no notch in the barrier layer 1141 and the buffer layer 1142 corresponding to the position of the first notch 1150.

For example, in some examples, the depth of the first notch 1150 is greater than zero and less than the thickness of the first insulation layer 1140, and the embodiments of the present disclosure are not limited thereto.

In the display substrate provided by an embodiment of the present disclosure, the display region includes an inorganic insulation layer, and the first insulation layer and the inorganic insulation layer are provided in the same layer and integrally connected. For example, in some examples, the first insulation layer located in the second peripheral region includes a plurality of first insulation sub-layers, and at least one of the plurality of first insulation sub-layers and the inorganic insulation layer of the display region are provided in the same layer and integrally connected. For example, in some examples, the inorganic insulation layer in the display region includes a plurality of inorganic insulation sub-layers, and the plurality of first insulation sub-layers included in the first insulation layer located in the second peripheral region and the plurality of inorganic insulation sub-layers included in the inorganic insulation layer located in the display region are integrally connected in one-to-one correspondence.

For example, as shown in FIG. 4, the display substrate 1100 also includes structural/functional layers such as a barrier layer 1141a, a buffer layer 1142a, a pixel drive layer 1210, a light-emitting device 1220, and an encapsulation layer, etc., which are sequentially arranged on the display region 1130 of the base substrate 1110. The buffer layer 1142a and the barrier layer 1141a can provide a flat surface for forming the pixel drive layer, and can prevent impurities possibly existing in the base substrate from diffusing into the pixel drive circuit to adversely affect the performance of the pixel circuit. The pixel drive layer 1210 is arranged on the display region 1130 of the base substrate 1110. For example, the pixel drive layer 1210 includes components such as a thin film transistor and a capacitor (not shown in the figure) on the base substrate 1110.

For example, as shown in FIG. 4, the thin film transistor includes an active layer 1211, a gate insulation layer 1143a, a gate electrode 1213, an interlayer insulation layer 1144a, a source electrode 1212, and a drain electrode 1214. For example, the barrier layer 1141a, the buffer layer 1142a, the gate insulation layer 1143a, and the interlayer insulation layer 1144a are stacked, and the stacked layer is realized as the inorganic insulation layer 1140a of the display region 1130. In this case, as shown in FIG. 4, the barrier layer 1141a of the display region and the barrier layer 1141 of the peripheral region are arranged in the same layer and integrally connected. The buffer layer 1142a of the display region and the buffer layer 1142 of the peripheral region are arranged in the same layer and integrally connected. The gate insulation layer 1143a of the display region and the gate insulation layer 1143 of the peripheral region are arranged in the same layer and integrally connected. The interlayer insulation layer 1144a of the display region and the interlayer insulation layer 1144 of the peripheral region are arranged in the same layer and integrally connected. In this way, these insulation layers arranged in the same layer and integrally connected can be integrally formed by using the same material layer in the manufacturing process of the display substrate.

For example, in some examples, the thin film transistor of the pixel drive layer in the display substrate may be a top gate type thin film transistor as shown in FIG. 4, but in other examples, the thin film transistor may also be a bottom gate type thin film transistor, a double gate type thin film transistor or other types of thin film transistors, which is not limited in the embodiments of the present embodiment.

For example, in some examples, the inorganic insulation layers in the display region 1130 of the display substrate 1100 are not limited to the above mentioned several insulation layers. For example, the inorganic insulation layer may include one or more of the barrier layer, the buffer layer, the gate insulation layer, and the interlayer insulation layer, or may also include other inorganic insulation layers, which is not limited by the embodiments of the present disclosure. In this case, the first insulation layer in the second peripheral region may include a first insulation sub-layer or first insulation sub-layers arranged in the same layer and integrally connected with one or more of inorganic insulation sub-layers in the inorganic insulation layer.

In the embodiments of the present disclosure, "arranged in the same layer" means that two structural/functional layers (for example, the inorganic insulation layer 1140a and the first insulation layer 1140) are in the same layer and formed by the same material in the multi-layer structure of the display substrate, that is, in the manufacturing process, the two structural/functional layers may be formed by the same material layer, for example, a material layer is formed first, and a patterning process is performed on the material layer to form the two structural/functional layers.

For example, the material of the active layer 1211 may include polysilicon or an oxide semiconductor (for example, indium gallium zinc oxide). The material of the gate electrode may include a metal material or an alloy material, for example, the gate electrode is a metal single-layer structure or a multi-layer structure formed by molybdenum, aluminum, titanium, etc. The material of the source electrode and the drain electrode may include a metal material or an alloy material, for example, each of the source electrode and the drain electrode is a metal single-layer structure or a multi-layer structure formed by molybdenum, aluminum, titanium, etc. The embodiments of the present disclosure do not specifically limit the material of each functional layer.

In the display substrate provided by an embodiment of the present disclosure, the display region further includes an organic insulation layer, and the covering layer of the peripheral region and the organic insulation layer are provided in the same layer and integrally connected. For example, as shown in FIG. 4, in one example, the pixel drive layer 1210 of the display region includes a pixel drive circuit and a planarization layer 1230 covering the pixel drive circuit to provide a flat surface on a side of the pixel drive circuit away from the base substrate, and the planarization layer 1230 is realized as the above-mentioned organic insulation layer located in the display region. For example, the covering layer 1160 in the second peripheral region 1122 and the planarization layer 1230 include organic materials, for example, polymer resin materials, such as polyimide (PI), polymethylmethacrylate, polystyrene (PS), aromatic, propylene-based polymers, phthalimide-based polymers, aryl ether-based polymers, amino polymers, fluorine-based polymers, para-xylene-based polymers, or vinyl alcohol-based polymers, etc.

For example, as shown in FIG. 4, in the pixel drive layer 1210, there are vias in the gate insulation layer 1143a and the interlayer insulation layer 1142a to expose a source region and a drain region of the active layer 1211, and the source electrode 1212 and the drain electrode 1214 are electrically connected with the source region and the drain region of the active layer 1211 respectively through the vias. The planarization layer 1230 is located above the source electrode 1212 and the drain electrode 1214 to planarize the surface of the pixel drive layer 1210 on the side away from the base substrate. The covering layer 1160 in the second peripheral region 1122 and the planarization layer 1230 are provided in the same layer and integrally connected, so that the covering layer 1160 and the planarization layer 1230 can be formed in the same layer in the manufacturing process, for example, formed by using the same material layer and the same patterning process. The planarization layer 1230 can planarize the uneven surface caused by the pixel drive circuit, and thus prevent defects in the light-emitting device caused by irregularities generated by the pixel drive circuit.

As shown in FIG. 4, a via is formed in the planarization layer 1230 of the display region 1130 to expose the source electrode 1213 or the drain electrode 1214 (as shown in the figure), and the light-emitting device 1220 is formed on the planarization layer 1215. The light-emitting device 1220 includes a first electrode 1221, a light-emitting layer 1222, and a second electrode 1223. The first electrode 1221 of the light-emitting device 1220 is electrically connected with the drain electrode 1214 through the via in the planarization layer 1230. A pixel defining layer 1240 is formed on the first electrode 1221. The pixel defining layer 1240 includes a plurality of openings to define a plurality of pixel units. Each of the plurality of openings exposes the first electrode 1221 of one pixel unit, and the light-emitting layer 1222 is in the plurality of openings of the pixel defining layer 1240. The second electrode 1223 may be arranged, for example, in a part or the whole display region, so as to be formed as a whole surface in the manufacturing process.

For example, the first electrode 1221 may include a reflective layer, and the second electrode 1223 may include a transparent layer or a translucent layer. Thus, the first electrode 1221 can reflect light emitted from the light-emitting layer 1222, and the part of light is emitted into the external environment through the second electrode 1223, thereby providing a light emission rate. In the case where the second electrode 1223 includes a semi-transmissive layer, some light reflected by the first electrode 1221 is reflected again by the second electrode 1223, so that the first electrode 1221 and the second electrode 1223 form a resonant structure, thereby improving light emission efficiency.

For example, the material of the first electrode 1221 may include at least one transparent conductive oxide material, which includes indium tin oxide (ITO), indium zinc oxide (IZO), zinc oxide (ZnO), etc. In addition, the first electrode 1221 may adopt a metal having high reflectivity as a reflective layer, such as silver (Ag). The light-emitting layer 1222 may include small molecule organic materials or polymer molecule organic materials, and may be fluorescent light-emitting materials or phosphorescent light-emitting materials, which can emit red light, green light, blue light, or white light. Furthermore, the light-emitting layer may further include functional layers such as an electron injection layer, an electron transport layer, a hole injection layer, a hole transport layer, and the like as required. The second electrode 1223 may include various conductive materials. For example, the second electrode 1223 may include metal materials such as lithium (Li), aluminum (Al), magnesium (Mg), or silver (Ag), etc.

For example, the material of the pixel defining layer 1240 may include organic materials such as polyimide, phthalimide, phthalamide, acrylic resin, benzocyclobutene or phenolic resin, which is not limited by the embodiments of the present disclosure.

For example, in some examples, the display substrate may further include an encapsulation layer. The orthographic projection of the encapsulation layer on the base substrate covers the display region and the first peripheral region. The encapsulation layer seals the light-emitting device, thereby reducing or preventing deterioration of the light-emitting device (especially the organic functional layer therein) caused by moisture and/or oxygen in the environment. The encapsulation layer may include a structure in which a plurality of inorganic layers and organic layers are stacked.

As shown in FIG. 4, the encapsulation layer includes a first encapsulation layer 1170a in the display region and a second encapsulation layer 1170 in the second peripheral region. The first encapsulation layer 1170a of the display region and the second encapsulation layer 1170 of the second peripheral region 1122 are arranged in the same layer and made of the same material. For example, the first encapsulation layer 1170a and the second encapsulation layer 1170 may have an integral structure, and thus may be integrally formed in the manufacturing process.

For example, in some examples, the first encapsulation layer 1170 of the second peripheral region 1122 may include a stack of a plurality of organic encapsulation layers and a plurality of inorganic encapsulation layers, and correspondingly, the second encapsulation layer 1170a of the display region may also include a stack of a plurality of organic encapsulation layers and a plurality of inorganic encapsulation layers. For example, as shown in FIG. 4, the second encapsulation layer 1170a of the display region includes a first organic encapsulation layer 1171a, a first inorganic encapsulation layer 1172a, a second organic encapsulation layer 1173a, and a second inorganic encapsulation layer 1174a. The second encapsulation layer 1170 of the second peripheral region 1122 includes a first organic encapsulation layer 1171, a first inorganic encapsulation layer 1172, a second organic encapsulation layer 1173, and a second inorganic encapsulation layer 1174. For example, the plurality of layers in the first encapsulation layer 1170a and the plurality of layers in the second encapsulation layer 1170 may be integrally connected in one-to-one correspondence.

For example, the materials of the inorganic encapsulation layers (that is, the first inorganic encapsulation layer and the second inorganic encapsulation layer) may include inorganic materials such as silicon nitride, silicon oxide, silicon oxynitride, etc., and the inorganic materials have high compactness, which can prevent invasion of water, oxygen, etc. For example, the materials of the organic encapsulation layers (such as the first organic encapsulation layer and the second organic encapsulation layer) may be organic materials such as polymer materials containing desiccants or polymer materials capable of blocking water vapor, the organic materials can flatten the surface of the display substrate and relieve the stress of the first inorganic encapsulation layer and the second inorganic encapsulation layer, and may also include water-absorbing materials such as desiccants to absorb water, oxygen and other substances invading the interior.

For example, in some examples, the light-emitting device 1220 may be an organic light-emitting diode (OLED), or may also be a quantum-dot light-emitting diode (QLED), and the light-emitting layer of the QLED includes quantum dot materials. The type of pixel drive circuits are described above, which will not be described in detail here, and the embodiments of the present disclosure are not limited in this aspect.

Figure 5:
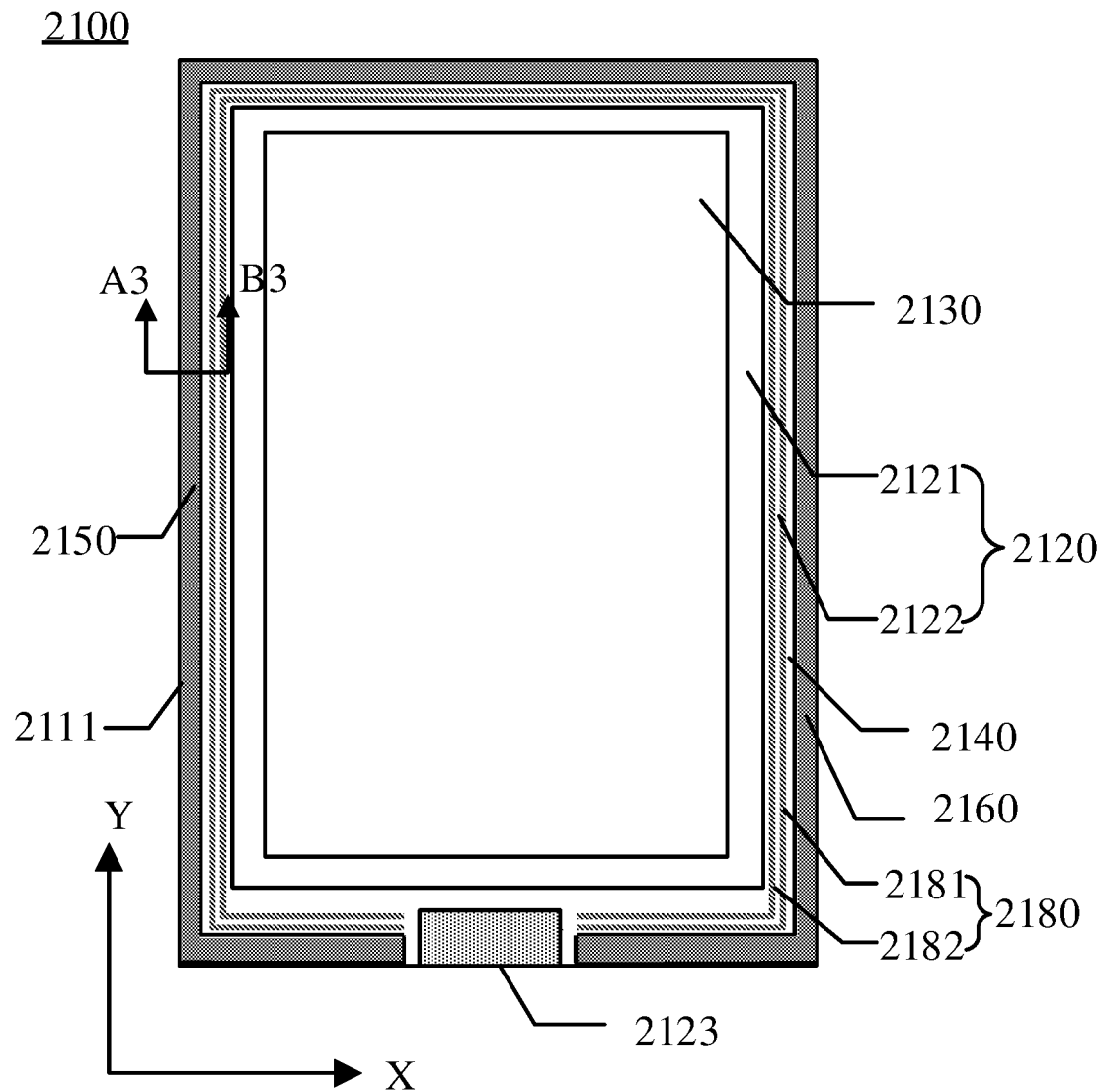
FIG. 5 is a schematic top view of another display substrate according to at least one embodiment of the present disclosure.
Figure 6A:
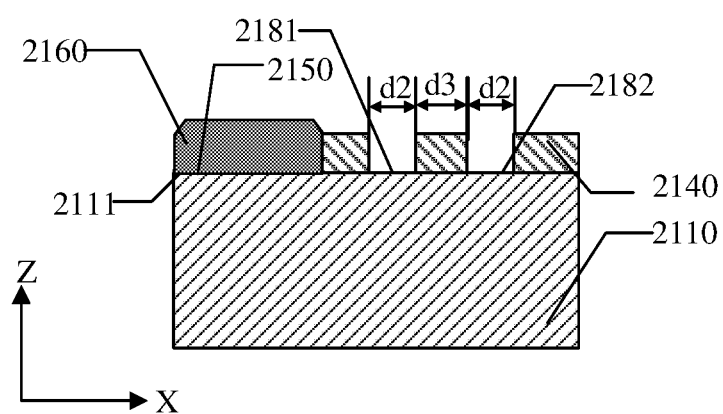
FIG. 6A is a schematic cross-sectional view of the display substrate as shown in FIG. 5 along a line A3-B3.

FIG. 5 is a schematic top view of another display substrate according to at least one embodiment of the present disclosure. FIG. 6A is a schematic cross-sectional view of the display substrate as shown in FIG. 5 along a line A3-B3.

As shown in FIG. 5, a display substrate 2100 includes a base substrate 2110, and the base substrate 2110 includes a display region 2130 and a peripheral region 2120. The peripheral region 2120 surrounds the display region 2130, and an edge of the peripheral region 2120 away from the display region 2130 is the same as an edge 2111 of the base substrate, that is, the edge of the peripheral region 2120 away from the display region 2130 is the edge 2111 of the base substrate. The peripheral region 2120 includes a first peripheral region 2121 and a second peripheral region 2122. The first peripheral region 2121 is located between the second peripheral region 2122 and the display region 2130. For example, the first peripheral region 2121 and the display region 2130 are the encapsulation region of the display substrate 2100 together.

As shown in FIG. 5 and FIG. 6A, the display substrate 2100 further includes a first insulation layer 2140 located in the second peripheral region 2122, and the first insulation layer 1140 includes a first notch 2150 at the position of at least a part of the edge 2111 of the base substrate 2110. The first notch 2150 extends along the edge 2111 of the base substrate 1110, and a side edge of the first notch 2150 away from the display region 2130 overlaps with the edge 2111 of the base substrate. In this case, the first notch 2150 exposes the at least a part of the edge 2111 of the base substrate 2110. Therefore, in the case where the display substrate 2100 is formed by cutting a mother substrate, the cutting line passes through the first notch 2150 and the first insulation layer 2140 is not cut at the first notch 2150, so that cracks caused by cutting the first insulation layer 2140 can be avoided.

For example, in some embodiments, the first notch 2150 surrounds the display region of the base substrate 2110, so that the first notch 2150 can provide crack protection around the display substrate 2100.

For example, in some embodiments, as shown in FIG. 5, the display substrate 2100 further includes a bonding region 2123 located on a side of the second peripheral region 2122 away from the display region 2130. For example, one end of the bonding region 2123 is electrically connected with a plurality of signal lines in the display region 2130, and the other end is bonded to an external drive element such as an external circuit board or a drive chip, thereby electrically connecting the display region 2130 with the external drive element. For example, as shown in FIG. 6A, the depth of the first notch 2150 may be equal to the thickness of the first insulation layer 2140, and the thickness of the first insulation layer 2140 is the distance from the surface of the first insulation layer 2140 away from the base substrate 2110 to the base substrate 2110. In this case, the first notch 2150 is formed by completely removing the first insulation layer 2140 at the corresponding position. For example, a covering layer 2160 is formed on the first notch 2150. An orthographic projection of the covering layer 2160 on the base substrate 2110 overlaps with an orthographic projection of the first notch 2150 on the base substrate 2110. The first notch 2150 can block cracks generated at the edge of the display substrate, thereby preventing the cracks from spreading to the second peripheral region and the display region. The covering layer 2160 can further improve the impact resistance of the display substrate to external forces at the edge. In addition, the covering layer can also prevent the warpage phenomenon at the edge of the base substrate.

For example, the first insulation layer further includes at least one second notch located in the second peripheral region, and the at least one second notch is on a side of the first notch close to the display region and at least partially parallel to the first notch, and the first notch and the at least one second notch are arranged at intervals.

For example, in some embodiments, the at least one second notch includes a plurality of second notches extending along a direction parallel to an edge of the base substrate close to the plurality of second notches, and the plurality of second notches are arranged at intervals in a direction perpendicular to the extending direction of the plurality of second notches.

For example, in some embodiments, as shown in FIG. 5 and FIG. 6A, the first insulation layer includes two second notches, which are named as a second notch 2181 and a second notch 2182. The second notch 2181 and the second notch 2182 are located in the second peripheral region 1121 and on a side of the first notch 2150 close to the display region 1130, and the second notch 2180 and the first notch 2140 extend in the same direction. For example, the second notch 2181 and the second notch 2182 are arranged in parallel with the first notch 2150, and the second notch 2181, the second notch 2182 and the first notch 2150 are arranged at intervals in the direction perpendicular to the side edge of the base substrate 2110. The second notch 2181 and the second notch 2182 can further block cracks at the edge of the display substrate, thereby preventing the cracks from extending to the second peripheral region and the display region. The gap between the first notch 2150 and the second notch 2181, and the gap between the second notch 2181 and the second notch 2182 can form barrier dams, which can further block cracks at the edge of the display substrate.

For example, the widths of the plurality of second notches in the direction perpendicular to the edge 2111 of the base substrate 2110 (the width is the distance between two parallel opposite sides of a second notch in the direction perpendicular to the side edge of the display substrate) may be the same. For example, as shown in FIG. 6A, the width of the second notch 2181 and the width of the second notch 2182 in the direction perpendicular to the edge 2111 of the base substrate 2110 are d2, for example, d2 may be selected to be about 5 microns. For example, the width d3 of the interval between the second notch 2181 and the second notch 2182 in the direction perpendicular to the side edge of the display panel may be about 5 microns. The embodiments of that present disclosure are not limited thereto.

For example, in some examples, the width of the second notch 2181 and the width of the second notch 2182 in the direction perpendicular to the edge 2111 of the base substrate 2110 may not be equal, and the embodiments of the present disclosure are not limited thereto.

As shown in FIG. 5 and FIG. 6A, the second notch 2181 and the second notch 2182 may surround the display region 1130, and the second notch 2181 and the second notch 2182 are disconnected at the bonding region 2123 when extending along the edge of the base substrate for circuit arrangement.

For example, in some examples, the widths of the plurality of second notches in the direction perpendicular to the extending direction of the plurality of second notches are identical, and the width of the first notch in the direction perpendicular to the extending direction of the first notch is larger than the widths of the plurality of second notches. For example, in one example, the second notch 2181 and the second notch 2182 have the same width in the direction perpendicular to the extending direction of the second notches, and the width is about 5 microns, for example. The width of the first notch 2150 in the direction perpendicular to the extending direction of the first notch is, for example, about 100 microns.

It should be noted that in the above examples, the number of the second notches is shown as two, and in other examples, the number of the second notches may be one or more, such as three, four, etc., and the embodiments of the present disclosure are limited thereto.

Figure 6B:
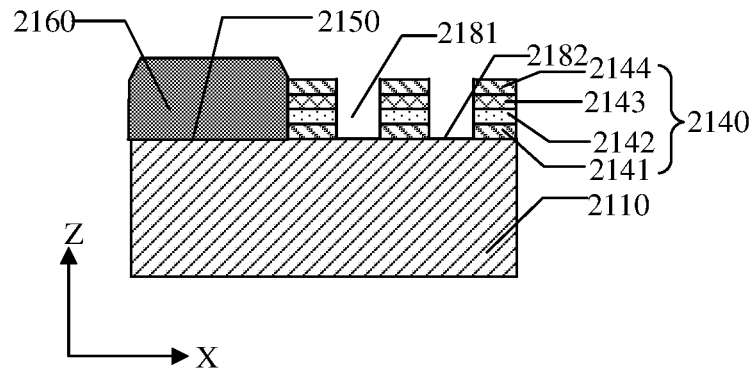
FIG. 6B is another schematic cross-sectional view of the display substrate as shown in FIG. 5 along the line A3-B3.

For example, in some examples, the first insulation layer includes a plurality of first insulation sub-layers. As shown in FIG. 6B, the first insulation layer 2140 includes a barrier layer 2141, a buffer layer 2142, a gate insulation layer 2143, and an interlayer insulation layer 2144 that are sequentially arranged on the base substrate 2110. As illustrated in the above embodiments, these insulation layers are integrally connected with a plurality of insulation layers in the display region in one-to-one correspondence. In the example as shown in FIG. 6B, the first notch 2150, the second notch 2181, and the second notch 2182 are formed by completely removing the materials of the barrier layer 2141, the buffer layer 2142, the gate insulation layer 2143, and the interlayer insulation layer 2140 at corresponding positions. Therefore, the depths of the second notch 2181 and the second notch 2182 are equal to a sum of the thicknesses of the barrier layer 2141, the buffer layer 2142, the gate insulation layer 2143, and the interlayer insulation layer 2140.

For example, in other examples, the depths of the plurality of second notches may be smaller than the thickness of the first insulation layer, and thus may be formed by partially removing the material of the first insulation layer. In this case, the depths of the plurality of second notches is greater than 0 and less than the thickness of the first insulation layer 1140. The embodiments of that present disclosure are not limited thereto.

Figure 7:
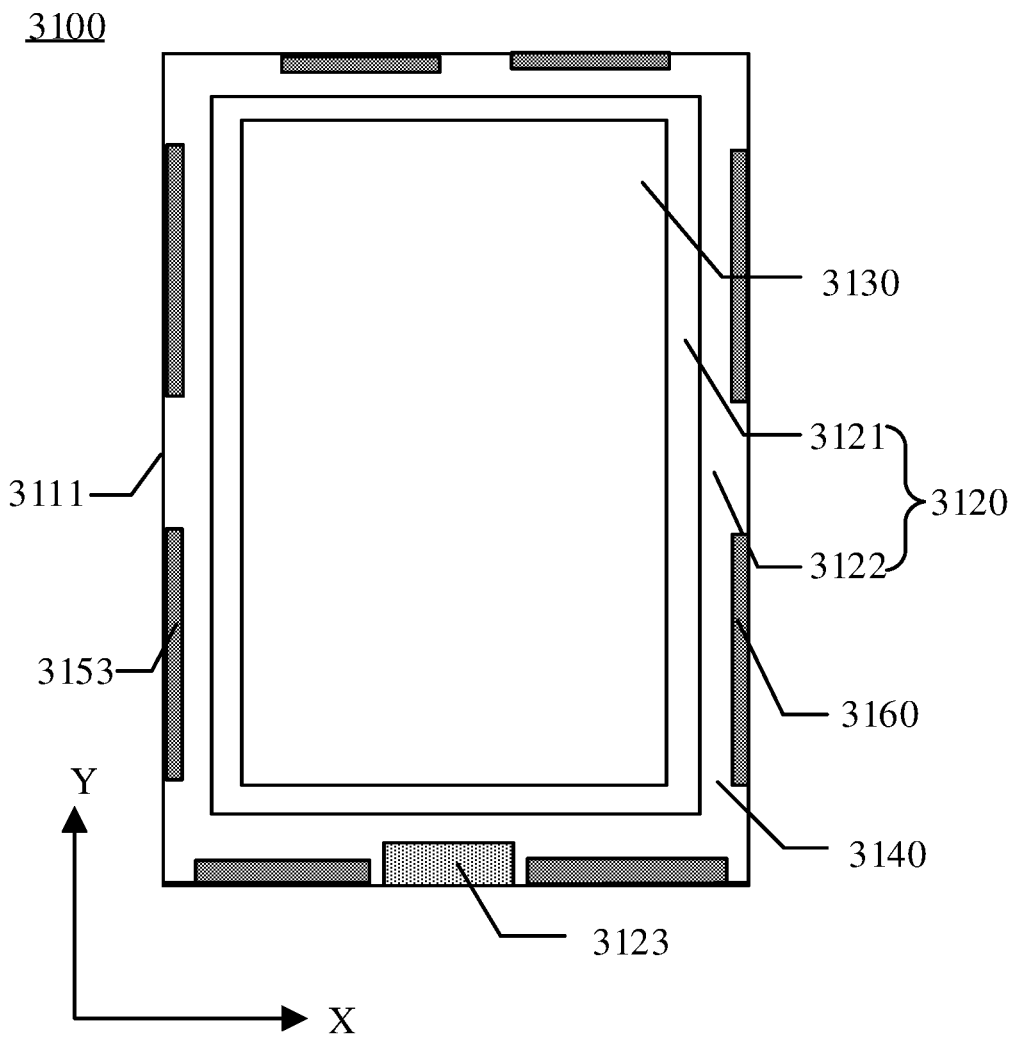
FIG. 7 is a schematic top view of another display substrate according to at least one embodiment of the present disclosure.

For example, in some examples, the first notch includes a plurality of first sub-notches arranged at intervals along the edge of the base substrate. FIG. 7 is a schematic top view of another display substrate according to at least one embodiment of the present disclosure. As shown in FIG. 7, a display substrate 3100 includes a base substrate 3110, and the base substrate 3110 includes a display region 3130 and a peripheral region 3120. An edge of the peripheral region 3120 away from the display region 3130 is the same as an edge 3111 of the base substrate, that is, the edge of the peripheral region 3120 away from the display region 3130 is the edge 3111 of the base substrate. The peripheral region 3120 surrounds the display region 3130. The peripheral region 3120 includes a first peripheral region 3121 and a second peripheral region 3122. The first peripheral region 3121 is located between the second peripheral region 3122 and the display region 3130. For example, the first peripheral region 3121 and the display region 3130 are the encapsulation region of the display substrate 3100 together.

As shown in FIG. 7, the display substrate 3100 further includes a first insulation layer 3140 located in the second peripheral region 3122, and the first insulation layer 3140 includes a plurality of first sub-notches 3153 arranged at intervals along the edge of the base substrate at the position of at least a part of the edge of the base substrate 3110. The plurality of first sub-notches 3153 surround the display region 3130, so that the plurality of first sub-notches 3153 can provide crack protection around the display substrate 3100.

For example, in some examples, as shown in FIG. 7, the display substrate 3100 further includes a bonding region 3123 located on a side of the second peripheral region 3122 away from the display region 3130. For example, one end of the bonding region 3123 is electrically connected with a plurality of signal lines in the display region 3130, and the other end is bonded to an external drive element such as an external circuit board or a drive chip, thereby electrically connecting the display region 3130 with the external drive element.

For example, as shown in FIG. 7, a covering layer 3160 is formed on the plurality of first sub-notches 3153. An orthographic projection of the covering layer 3160 on the base substrate 3110 overlaps with orthographic projections of the plurality of first sub-notches 3153 on the base substrate 3110. The plurality of first sub-notches 3153 can play a role in blocking cracks at the edge of the display substrate, thereby preventing the cracks from extending to the second peripheral region and the display region. The covering layer 3160 can further improve the impact resistance of the display substrate to external forces at the edge. In addition, the covering layer can also prevent the warpage phenomenon at the edge of the base substrate.

For example, in some examples, the number of the first sub-notches 3153 may be multiple, for example, four, eight, etc., and the embodiments of the present disclosure do not limit the number of the first sub-notch 3153.

An embodiment of the present disclosure further provides a display substrate, different from the above examples, in this display substrate, the first insulation layer located in the second peripheral region includes a notch only at the position of at least a part of the edge of the base substrate, the notch extends along the edge of the base substrate, and a side edge of the notch away from the display region overlaps with the edge of the base substrate.

Figure 8:
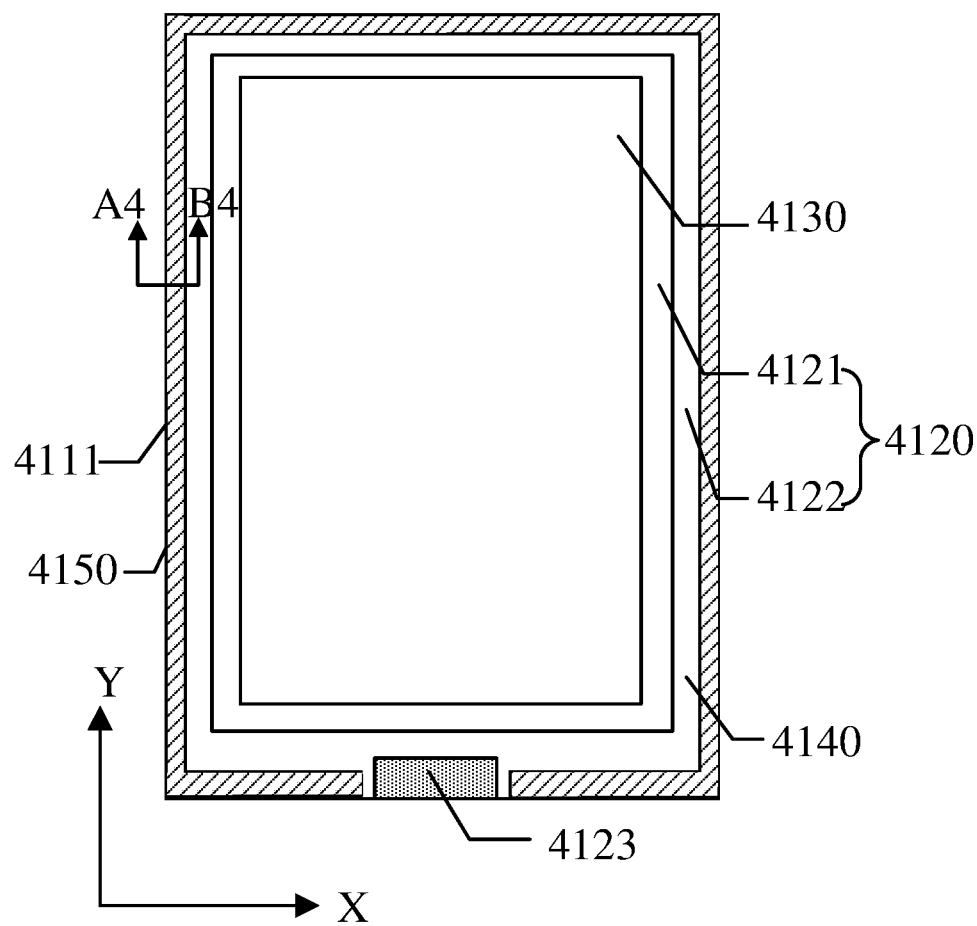
FIG. 8 is a schematic top view of another display substrate according to at least one embodiment of the present disclosure.
Figure 9A:
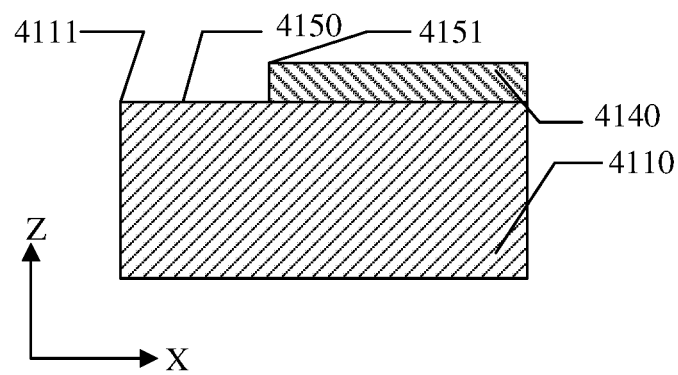
FIG. 9A is a schematic cross-sectional view of the display substrate as shown in FIG. 8 along a line A4-B4.

FIG. 8 is a schematic top view of another display substrate according to at least one embodiment of the present disclosure. FIG. 9A is a schematic cross-sectional view of the display substrate as shown in FIG. 8 along a line A4-B4. As shown in FIG. 8 and FIG. 9A, a display substrate 4100 includes a base substrate 4110, and the base substrate 4110 includes a display region 4130 and a peripheral region 4120. The peripheral region 4120 surrounds the display region 4130, and an edge of the peripheral region 4120 away from the display region 4130 is the same as an edge 4111 of the base substrate. The peripheral region 4120 includes a first peripheral region 4121 and a second peripheral region 4122. The first peripheral region 4121 is located between the second peripheral region 4122 and the display region 4130. The first peripheral region 4121 and the display region 4130 are the encapsulation region of the display substrate 4100 together.

As shown in FIG. 8 and FIG. 9A, the display substrate 4100 further includes a first insulation layer 4140 located in the second peripheral region 4122, and the first insulation layer 4140 includes a notch 4150 only at the position of at least a part of the edge of the base substrate 4110. The notch 4150 extends along the edge 4111 of the base substrate 4110, and a side edge of the notch 4150 away from the display region 4130 overlaps with the edge 4111 of the base substrate. The notch 4150 surrounds the display region 3130, so that the notch 4150 can provide crack protection around the display substrate 4100.

For example, in some examples, as shown in FIG. 8, the display substrate 4100 further includes a bonding region 4123 located on a side of the second peripheral region 4122 away from the display region 4130. For example, one end of the bonding region 4123 is electrically connected with a plurality of signal lines in the display region 4130, and the other end is bonded to an external drive element such as an external circuit board or a drive chip, thereby electrically connecting the display region 4130 with the external drive element.

As shown in FIG. 9A, the notch 4150 is located at the position of at least a part of the edge 4111 of the base substrate 4110, so that in the case where the display substrate 4100 is formed by cutting a mother substrate, the cutting line passes through the notch 4150 and the first insulation layer 4140 is not cut at the notch 4150, thereby avoiding cracks caused by cutting the first insulation layer 4140.

For example, in some examples, the depth of the notch 4150 may be equal to the thickness of the first insulation layer 4140. In this case, the notch 4150 is formed by completely removing the first insulation layer 4140 at the corresponding position. The width of the notch 4150 (that is, the distance between the side edge 4151 of the first notch and the edge 4111 of the base substrate in a direction perpendicular to the side edge of the display substrate), for example, may be selected to be about 100 microns, but the embodiments of the present disclosure are not limited thereto. The distance between the side edge 4151 of the notch and the display region 4130 may be selected according to the width of the peripheral region of the display substrate, for example, may be selected to be 1 micron, which is not limited by the embodiments of the present disclosure. The notch can play a role in blocking cracks at the edge of the display substrate, thereby preventing the cracks from extending to the second peripheral region and the display region.

Figure 9B:
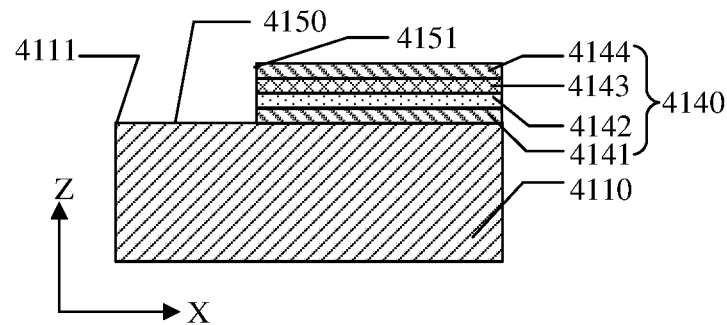
FIG. 9B is another schematic cross-sectional view of the display substrate as shown in FIG. 8 along the line A4-B4.

For example, in some examples, the first insulation layer includes a plurality of first insulation sub-layers. As shown in FIG. 9B, the first insulation layer 4140 includes a barrier layer 4141, a buffer layer 4142, a gate insulation layer 4143, and an interlayer insulation layer 4144 that are sequentially arranged on the base substrate 4110. For example, the notch 4150 is formed by removing materials of the barrier layer 1141, the buffer layer 1142, the gate insulation layer 1143, and the interlayer insulation layer 1144 at the corresponding position.

Figure 9C:
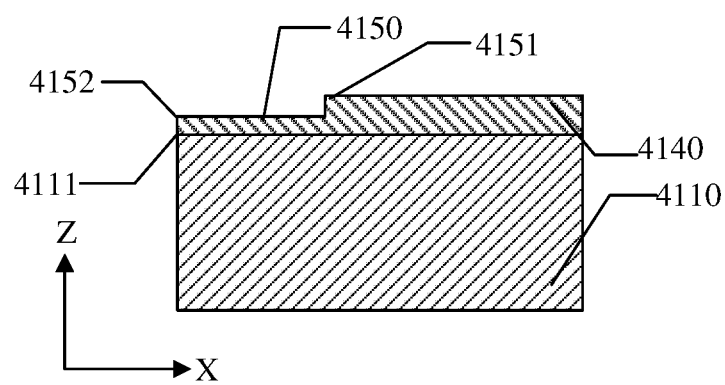
FIG. 9C is another schematic cross-sectional view of the display substrate as shown in FIG. 8 along the line A4-B4.
Figure 9D:
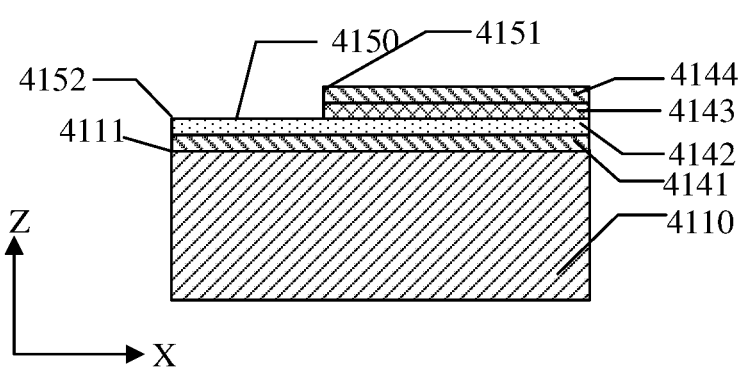
FIG. 9D is another schematic cross-sectional view of the display substrate as shown in FIG. 8 along the line A4-B4.

For example, in some examples, the depth of the notch may also be less than the thickness of the first insulation layer. As shown in FIG. 9C and FIG. 9D, the notch 4150 is formed by removing a part of the first insulation layer 4140 at the corresponding position, so that the first insulation layer 4140 at the edge of the base substrate 4110 is in a stepped shape. The edge 4152 of the first insulation layer 4140 away from the display region 4130 overlaps with the edge 4111 of the base substrate 4100.

For example, in the example shown in FIG. 9D, the first insulation layer 4140 includes a barrier layer 4141, a buffer layer 4142, a gate insulation layer 4143, and an interlayer insulation layer 4144 that are sequentially arranged on the base substrate 4110. The depth of the notch 4150 is equal to a sum of the thickness of the gate insulation layer 4143 and the thickness of interlayer insulation layer 4144. In this case, the notch 4150 is formed by removing the gate insulation layer 4143 and the interlayer insulation layer 4144 at the corresponding position.

For example, the depth of the notch 4150 may be greater than zero and less than the thickness of the first insulation layer 4140, and the embodiments of the present disclosure are not limited thereto.

The material of the first insulation layer, the multi-layer structure of the first insulation layer, the material and the multi-layer structure of the inorganic insulation layers in the display region, and the relationship thereof can be referred to the above embodiments, and will not be described in detail here.

At least one embodiment of the present disclosure further provides a display device, which may include the display substrate of any one of the above embodiments.

For example, in some examples, the display device may further include a flexible circuit board and a control chip. The flexible circuit board and the control chip are bonded to the bonding region of the display substrate.

For example, the control chip may be a central processing unit, a digital signal processor, a system chip (SoC), etc. For example, the control chip may also include a memory, a power supply module, etc., and power supply function and signal input and output function are realized through additionally arranged wires, signal lines, etc. For example, the control chip may further include a hardware circuit, computer executable code, etc. The hardware circuit may include conventional very large scale integration (VLSI) circuits or gate arrays, and existing semiconductors such as logic chips, transistors, or other discrete components. The hardware circuit may further include field programmable gate arrays, programmable array logic, programmable logic devices, etc.

For example, the display device provided by at least one embodiment of the present disclosure may be any product or component having a display function such as a mobile phone, a tablet computer, a television, a display, a notebook computer, a digital photo frame, a navigator, etc.

At least one embodiment of the present disclosure further provides a manufacturing method of a display substrate, and the method includes: providing a base substrate, in which the base substrate includes a display region and a peripheral region, the peripheral region surrounds the display region and an edge of the peripheral region away from the display region is the same as an edge of the base substrate, the peripheral region includes a first peripheral region and a second peripheral region, and the first peripheral region is located between the display region and the second peripheral region; forming a pixel drive layer on the display region of the base substrate; forming a light-emitting device on the pixel drive layer; forming an encapsulation layer on the light-emitting device, in which an orthographic projection of the encapsulation layer on the base substrate covers the display region and the first peripheral region; forming a first insulation layer on the second peripheral region of the base substrate, in which the first insulation layer includes a first notch at a position of at least a part of the edge of the base substrate, a length direction of the first notch extends along the edge of the base substrate; forming a covering layer on the second peripheral region of the base substrate, in which the covering layer is at least partially filled in the first notch; and cutting the base substrate to obtain an independent display substrate, in which a cutting line of the cutting passes through the first notch, so that a side edge of the first notch away from the display region overlaps with the edge of the base substrate.

In the display substrate obtained by the manufacturing method of the above embodiment, the first insulation layer located in the second peripheral region of the display substrate includes a first notch at a position of at least a part of the edge of the base substrate, and includes a covering layer on the first notch, so that in the case where the edge of the display substrate is cut, for example, in the case where a separate display substrate is formed by cutting a mother substrate, the first notch can prevent the edge that is cut from generating cracks or can block the propagation of cracks, and the covering layer on the first notch further improve the impact resistance of the display substrate to external forces at the edge, thereby further preventing cracks from extending to the second peripheral region and the display region. In addition, the covering layer can also prevent the warpage phenomenon at the edge of the base substrate and ensure the quality of the display substrate.

For example, in some examples, forming the first insulation layer includes: coating a first insulation material layer on the base substrate; and performing a patterning process on the first insulation material layer to form the first insulation layer including the first notch.

For example, a patterning process includes photoresist coating, exposing, developing, etching and removing part or all of the photoresist. For example, in the exposing process of the patterning process, the photoresist may be exposed through a mask to form a photoresist pattern.

For example, in some examples, performing the patterning process on the first insulation material layer includes: coating a photoresist film on the first insulation material layer; exposing and developing the photoresist film to form a photoresist pattern, in which the photoresist pattern exposes at least a part of the side edge of the first insulation layer; and etching a portion, which is exposed, of the first insulation material layer to form the first notch. The first notch can play a role in blocking cracks at the edge of the display substrate and improve the impact resistance of the display substrate to external forces at the edge, thereby preventing the cracks from extending to the second peripheral region and the display region.

For example, the manufacturing method of a display substrate provided by at least one embodiment of the present disclosure further includes: forming an inorganic insulation layer in the display region, in which the first insulation layer is formed in the same layer as the inorganic insulation layer.

For example, the manufacturing method of a display substrate provided by at least one embodiment of the present disclosure further includes: forming an organic insulation layer in the display region, in which the covering layer is formed in the same layer as the organic insulation layer.

Next, taking the display substrate shown in FIG. 4 as an example, the manufacturing method of the display substrate in the embodiments of the present disclosure will be described in detail with reference to FIG. 10A to FIG. 10F.

Figure 10A:
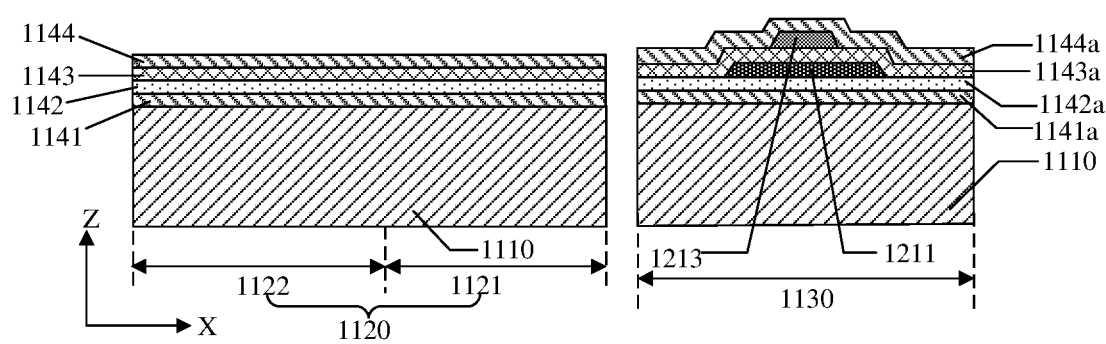
FIG. 10A to FIG. 10F are schematic diagrams of a display substrate in a manufacturing process according to at least one embodiment of the present disclosure.

As shown in FIG. 10A, a base substrate 1110 is provided, the base substrate 1110 can be used for forming a plurality of display substrates (referring to FIG. 1), and thus includes a plurality of portions for forming a plurality of display substrates (FIG. 10A-FIG. 10F show a portion for forming one display substrate). The portion of the base substrate 1110 for forming each display substrate includes a display region 1130 and a peripheral region 1120, and the peripheral region 1120 includes a first peripheral region 1121 and a second peripheral region 1120.

First, forming a barrier layer on the base substrate 1110, for example, by a deposition method. The barrier layer includes a barrier layer 1141 in the peripheral region 1120 and a barrier layer 1141a in the display region, which are formed integrally, then a buffer layer is formed on the barrier layer by a deposition method, and the buffer layer includes a buffer layer 1142 in the peripheral region and a buffer layer 142a in the display region, which are formed integrally.

For example, the base substrate 1110 may be a glass plate, a quartz plate, a metal plate or a resin plate, a flexible film (such as a polyimide film), etc. The materials of the barrier layer 1141 and the buffer layer 1142 may include inorganic insulation materials such as silicon oxide, silicon nitride, and silicon oxynitride, etc., and the materials of the barrier layer 1141 and the buffer layer 1142 may be the same or different. The barrier layer 1141 and the buffer layer 1142 can prevent harmful substances in the base substrate from intruding into the inside of the display substrate, and can also increase the adhesion of the film layer in the display substrate to the base substrate.

For example, after forming the buffer layer, forming a pixel drive layer on the buffer layer. For example, a semiconductor material layer is deposited on the base substrate 1110, and then a patterning process is performed on the semiconductor material layer to form an active layer 1211. The active layer 1211 includes a channel region in a semiconductor state, and a source region and a drain region which are located at opposite sides of the channel region and are conductive.

For example, the semiconductor material of the active layer 1211 may include polysilicon or oxide semiconductor. In some examples, the semiconductor material may be doped to form the conductive source region and the conductive drain region.

For example, after forming the active layer 1211, forming a gate insulation layer on the active layer 1211 by a deposition method, etc. The gate insulation layer includes a gate insulation layer 1143a in the display region and a gate insulation layer 1143 in the peripheral region. The material of the gate insulation layer may include inorganic insulation materials such as silicon oxide, silicon nitride, silicon oxynitride, etc.

For example, after forming the gate insulation layer, forming a gate electrode 1213 on the gate insulation layer 1143a of the display region by a patterning process. For example, a gate material layer is formed on the gate insulation layer, and then a patterning process is performed on the gate material layer to form the gate electrode 1213. The material of the gate electrode 1213 may include a metal material or an alloy material, such as the metal material or the alloy material of molybdenum, aluminum, titanium, etc.

For example, after forming the gate electrode 1213, forming an interlayer insulation layer on the gate electrode 1213 by a deposition method, etc. The interlayer insulation layer includes an interlayer insulation layer 1144a in the display region and an interlayer insulation layer 1144 in the peripheral region. The material of the interlayer insulation layer may include inorganic insulation materials such as silicon oxide, silicon nitride, silicon oxynitride, etc.

For example, the barrier layer 1141, the buffer layer 1142, the gate insulation layer 1143, and the interlayer insulation layer 1144 in the peripheral region 1120 are stacked, and the staked layer is realized as the first insulation layer.

Figure 10B:
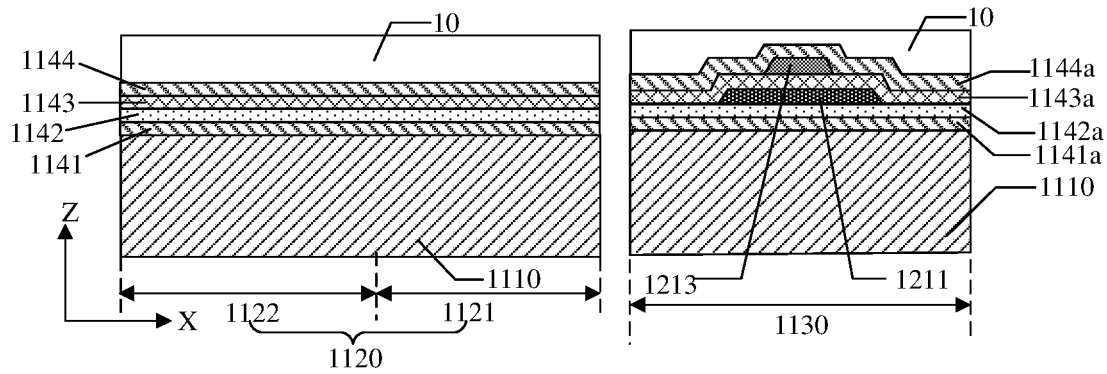
Figure 10C:
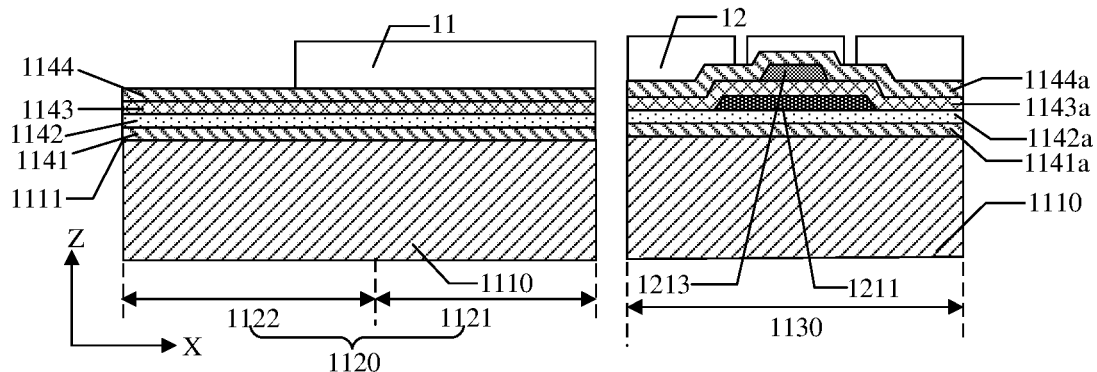
Figure 10D:
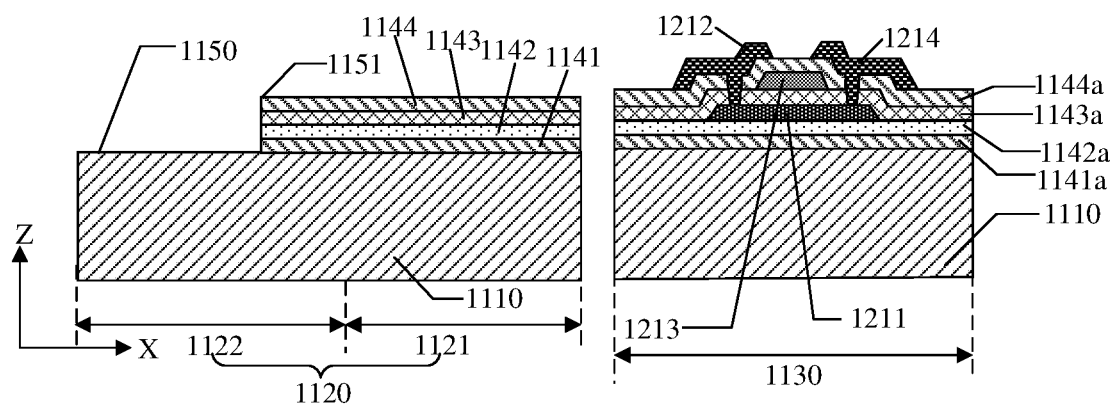

As shown in FIG. 10B-FIG. 10D, by a single patterning process, a first notch is formed in the first insulation layer of the second peripheral region and vias exposing the source region and drain region of the active layer are formed in the gate insulation layer 1143a and the interlayer insulation layer 1144a of the display region.

For example, as shown in FIG. 10B, coating a photoresist film 10 on the display region 1130 and the peripheral region 1120 of the display substrate. The photoresist film 10 covers the interlayer insulation layer 1144 in the peripheral region 1120 and the interlayer insulation layer 1144a in the display region 1130.

For example, the photoresist film 10 may adopt a positive photoresist or a negative photoresist. The photoresist film 10 in the present embodiment is described by taking the positive photoresist as an example.

As shown in FIG. 10C, exposing and developing the photoresist film to form a photoresist pattern. The photoresist pattern includes a first part of the photoresist pattern 11 in the peripheral region 1120 and a second part of the photoresist pattern 12 in the display region 1130. The first part of the photoresist pattern 11 exposes the edge 1111 of the base substrate, and the second part of the photoresist pattern 12 exposes positions where the vias will be formed in the display region.

As shown in FIG. 10D, etching a portion, which is exposed, of the first insulation material layer to form a first notch 1150, and etching the gate insulation layer 1143a and the interlayer insulation layer 1144a in the display region to form two vias exposing the source region and drain region of the active layer, respectively.

After forming the vias in the gate insulation layer 1143a and the interlayer insulation layer 1144a, forming a source-drain material layer on the interlayer insulation layer 1144a by a deposition method or a sputtering method, and then performing a patterning process on the source-drain material layer to form a source electrode 1212 and a drain electrode 1214. The source electrode 1212 and the drain electrode 1214 are electrically connected to the source region and the drain region of the active layer 1211 through the vias, respectively. The source-drain materials include a metal material or an alloy material, such as molybdenum, aluminum, titanium, etc.

For example, in FIG. 10D, the depth of the first notch is equal to the sum of the thicknesses of the barrier layer 1141, the buffer layer 1142, the gate insulation layer 1143, and the interlayer insulation layer 1144. In other examples, the depth of the first notch may be less than the sum of the thicknesses of the barrier layer 1141, the buffer layer 1142, the gate insulation layer 1143, and the interlayer insulation layer 1144, so that the first notch may be formed by partially etching the barrier layer 1141, the buffer layer 1142, the gate insulation layer 1143, and the interlayer insulation layer 1144.

Figure 10E:
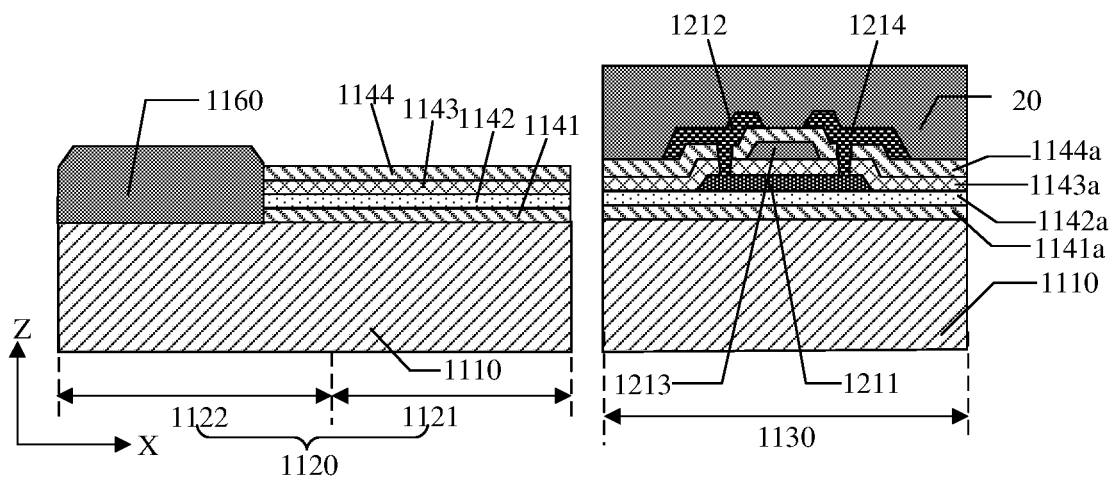

As shown in FIG. 10E, forming a covering layer 1160 in the second peripheral region and a planarization layer 1230 in the display region by a single patterning process. For example, an organic material layer may be formed on the first notch 1150, the source electrode 1212, and the drain electrode 1214 by coating, etc., and then a patterning process is performed on the organic material layer to form the covering layer 1160 in the second peripheral region and the planarization layer 1230 in the display region. The covering layer formed in the second peripheral region 1122 is at least partially filled in the first notch, and a via exposing the drain electrode 1214 is formed in the planarization layer.

For example, the above organic material may include polyimide (PI), polymethylmethacrylate, polystyrene (PS), aromatic, propylene-based polymers, phthalimide-based polymers, aryl ether-based polymers, amino polymers, fluorine-based polymers, para-xylene-based polymers, or vinyl alcohol-based polymers, etc.

Figure 10F:
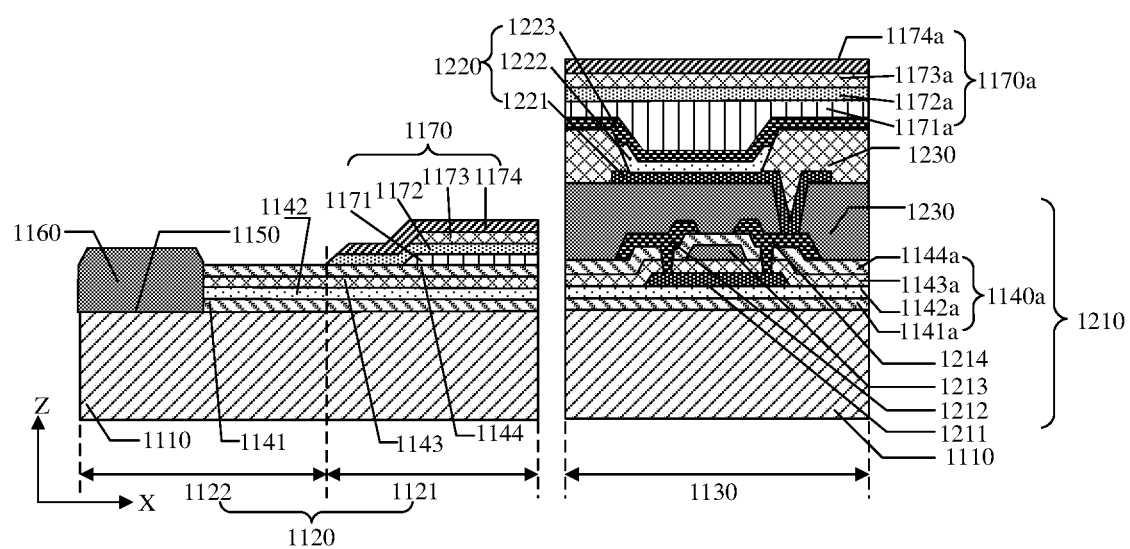

As shown in FIG. 10F, forming a light-emitting device 1220 and an encapsulation layer on the planarization layer 1230. For example, a first conductive material layer is formed on the planarization layer 1230 by a depositing method or a sputtering method, then a patterning process is performed on the first conductive material layer to form a first electrode 1221, and the first electrode 1221 is electrically connected with the drain electrode 1214 through the via hole in the planarization layer 1230.

Forming a pixel defining material layer on the first electrode 1221 by a coating method or the like, and then performing a patterning process on the pixel defining material layer to form a pixel defining layer 1230 including a plurality of openings. Each of the plurality of openings exposes the first electrode 1221.

Forming a light-emitting layer 1222 in each of the plurality of openings of the pixel defining layer 1230 by an evaporation method or an inkjet printing method, then forming a second conductive material layer by a depositing method or a sputtering method, and performing a patterning process on the second conductive material layer to form a second electrode 1223.

For example, the first conductive material layer may include at least one transparent conductive oxide material, which includes indium tin oxide (ITO), indium zinc oxide (IZO), zinc oxide (ZnO), etc. In addition, the first conductive material layer may include a metal having high reflectivity, such as silver (Ag). The organic materials may include small molecular organic materials or polymer molecular organic materials. The second conductive material may include various conductive materials, such as lithium (Li), aluminum (Al), magnesium (Mg), silver (Ag), or the like. The material of the pixel defining layer 1240 may include organic materials such as polyimide, phthalimide, phthalamide, acrylic resin, benzocyclobutene, or phenolic resin, etc.

As shown in FIG. 10F, after forming the light-emitting device, forming an encapsulation layer. For example, the encapsulation layer may be integrally formed in the display region and the first peripheral region, so that the encapsulation layer includes a first encapsulation layer 1170a in the display region and a second encapsulation layer 1170 in the first peripheral region that are integrally formed.

For example, the encapsulation layer includes a stacked structure of a plurality of inorganic encapsulation layers and a plurality of organic encapsulation layers. As shown in FIG. 10F, a first organic material is coated on the interlayer insulation layer 1144 in the peripheral region and the second electrode 1223 in the display region, thereby forming a first organic encapsulation layer 1171 and a first organic encapsulation layer 1171a that are integrally connected. A first inorganic material is deposited on the first organic encapsulation layer 1171 and the first organic encapsulation layer 1171a, thereby forming a first inorganic encapsulation layer 1172 and a first inorganic encapsulation layer 1172a that are integrally connected. A second organic material is coated on the first inorganic encapsulation layer 1172 and the first inorganic encapsulation layer 1172a, thereby forming a second organic encapsulation layer 1173 and a second organic encapsulation layer 1173a that are integrally connected. A second inorganic material is deposited on the second organic encapsulation layer 1173 and the second organic encapsulation layer 1173a, thereby forming a second inorganic encapsulation layer 1174 and a second inorganic encapsulation layer 1174a that are integrally connected.

For example, the materials of the inorganic encapsulation layers (that is, the first inorganic encapsulation layer and the second inorganic encapsulation layer) may include inorganic materials such as silicon nitride, silicon oxide, silicon oxynitride, etc., and the inorganic materials have high compactness, which can prevent invasion of water, oxygen, etc. For example, the materials of the organic encapsulation layers (such as the first organic encapsulation layer and the second organic encapsulation layer) may be organic materials such as polymer materials containing desiccants or polymer materials capable of blocking water vapor, the organic materials can flatten the surface of the display substrate and relieve the stress of the first inorganic encapsulation layer and the second inorganic encapsulation layer, and may also include water-absorbing materials such as desiccants to absorb water, oxygen and other substances invading the interior.

In the display substrate manufactured by the manufacturing method, the first insulation layer located in the second peripheral region of the display substrate includes a first notch at a position of at least a part of the edge of the base substrate, and includes a covering layer on the first notch, so that in the case where the edge of the display substrate is cut, for example, in the case where a separate display substrate is formed by cutting a mother substrate, cutting lines pass through the first notch, and the first notch can prevent the edge that is cut from generating cracks or can block the propagation of cracks, and the covering layer on the first notch can further improve the impact resistance of the display substrate to external forces at the edge, thereby further preventing cracks from extending to the second peripheral region and the display region. In addition, the covering layer can also prevent the warpage phenomenon at the edge of the base substrate and ensure the quality of the display substrate.

The following statements should be noted:
(1) The accompanying drawings involve only the structure(s) in connection with the embodiment(s) of the present disclosure, and other structure(s) can be referred to common design(s).
(2) For the purpose of clarity only, in accompanying drawings for illustrating the embodiment(s) of the present disclosure, the thickness and size of a layer or a structure may be enlarged or narrowed, that is, the drawings are not drawn in a real scale.
(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, comprising:
a base substrate comprising a display region and a peripheral region, wherein the peripheral region surrounds the display region, an edge of the peripheral region away from the display region is identical to an edge of the base substrate, the peripheral region comprises a first peripheral region and a second peripheral region, and the first peripheral region is between the display region and the second peripheral region;
a pixel drive layer on the display region of the base substrate;
a light-emitting device on the pixel drive layer;
an encapsulation layer on the light-emitting device, wherein an orthographic projection of the encapsulation layer on the base substrate covers the display region and the first peripheral region;
a first insulation layer on the base substrate, wherein the first insulation layer comprises a first notch in the second peripheral region at a position of at least a part of the edge of the base substrate, the first notch extends along the edge of the base substrate, and a side edge of the first notch away from the display region overlaps with the edge of the base substrate;
a covering layer in the second peripheral region, wherein the covering layer is at least partially filled in the first notch, and an orthographic projection of the covering layer on the base substrate at least partially overlaps with an orthographic projection of the first notch on the base substrate; and
an outer side edge of the covering layer is basically flush with the edge of the base substrate; and
wherein the first insulation layer on the base substrate further comprises at least one second notch in the first peripheral region, and the at least one second notch is on a side of the first notch close to the display region and at least partially parallel to the first notch, and the first notch and the at least one second notch are provided at intervals; and
the orthographic projection of the covering layer on the base substrate does not overlap with an orthographic projection of the at least one second notch on the base substrate.

2. The display substrate according to claim 1, wherein the covering layer further at least partially extends to the first insulation layer outside the first notch, and the orthographic projection of the covering layer on the base substrate further overlaps with an orthographic projection of an edge of the first insulation layer close to the first notch on the base substrate.

3. The display substrate according to claim 1, wherein a maximum thickness of the covering layer filled in the first notch is greater than a thickness of the first insulation layer.

4. The display substrate according to claim 1, wherein the at least one second notch comprises a plurality of second notches, and
the plurality of second notches extend along a direction parallel to an edge of the base substrate close to the plurality of second notches, and the plurality of second notches are provided at intervals along a direction perpendicular to an extending direction of the plurality of second notches.

5. The display substrate according to claim 4, wherein widths of the plurality of second notches in the direction perpendicular to the extending direction of the plurality of second notches are identical, and
a width of the first notch in a direction perpendicular to an extending direction of the first notch is larger than the widths of the plurality of the second notches.

6. The display substrate according to claim 1, wherein a depth of the first notch is equal to or less than a thickness of the first insulation layer.

7. The display substrate according to claim 6, wherein the first notch comprises a plurality of first sub-notches provided at intervals along the edge of the base substrate.

8. The display substrate according to claim 6, wherein the display region comprises an inorganic insulation layer, and
the first insulation layer comprises a plurality of first insulation sub-layers, the inorganic insulation layer comprises a plurality of inorganic insulation sub-layers, and the plurality of first insulation sub-layers and the plurality of inorganic insulation sub-layers are integrally connected in one-to-one correspondence.

9. The display substrate according to claim 1, wherein the first notch surrounds the display region of the base substrate.

10. The display substrate according to claim 9, further comprising a bonding region on a side of the second peripheral region away from the display region,
wherein the first notch is disconnected at the bonding region, and
the at least one second notch is disconnected at the bonding region.

11. The display substrate according to claim 1, wherein the display region comprises an inorganic insulation layer, and
the first insulation layer and the inorganic insulation layer are in a same layer and integrally connected.

12. The display substrate according to claim 1, wherein the display region further comprises an organic insulation layer, and the covering layer is in a same layer and made of a same material as the organic insulation layer.

13. The display substrate according to claim 12, wherein the pixel drive layer of the display region comprises a pixel drive circuit and a planarization layer configured to provide a flat surface on a side of the pixel drive circuit away from the base substrate, and
the organic insulation layer comprises the planarization layer.

14. A display device, comprising the display substrate according to claim 1.

15. A display substrate, comprising:
a base substrate comprising a display region and a peripheral region, wherein the peripheral region surrounds the display region, an edge of the peripheral region away from the display region is identical to an edge of the base substrate, the peripheral region comprises a first peripheral region and a second peripheral region, and the first peripheral region is between the display region and the second peripheral region;
a pixel drive layer on the display region of the base substrate;
a light-emitting device on the pixel drive layer;
an encapsulation layer on the light-emitting device, wherein an orthographic projection of the encapsulation layer on the base substrate covers the display region and the first peripheral region;
a first insulation layer on the base substrate, wherein the first insulation layer comprises a first notch in the second peripheral region only at a position of at least a part of the edge of the base substrate, the first notch extends along the edge of the base substrate, and a side edge of the first notch away from the display region overlaps with the edge of the base substrate;
a covering layer on the base substrate, wherein the covering layer is at least partially filled in the first notch, wherein the covering layer further at least partially extends to the first insulation layer outside the first notch, and the orthographic projection of the covering layer on the base substrate further overlaps with an orthographic projection of an edge of the first insulation layer close to the first notch on the base substrate; and
an outer side edge of the covering layer is basically flush with the edge of the base substrate.

16. The display substrate according to claim 15, wherein a depth of the notch is equal to or less than a thickness of the first insulation layer; and
the notch surrounds the display region of the base substrate.

17. A manufacturing method of a display substrate, comprising:

providing a base substrate, wherein the base substrate comprises a display region and a peripheral region, the peripheral region surrounds the display region, an edge of the peripheral region away from the display region is identical to an edge of the base substrate, the peripheral region comprises a first peripheral region and a second peripheral region, and the first peripheral region is between the display region and the second peripheral region;
forming a pixel drive layer on the display region of the base substrate;
forming a light-emitting device on the pixel drive layer;
forming an encapsulation layer on the light-emitting device, wherein an orthographic projection of the encapsulation layer on the base substrate covers the display region and the first peripheral region;
forming a first insulation layer on the second peripheral region of the base substrate, wherein the first insulation layer comprises a first notch in the second peripheral region at a position of at least a part of the edge of the base substrate, a length direction of the first notch extends along the edge of the base substrate;
forming a covering layer on the second peripheral region of the base substrate, wherein the covering layer is at least partially filled in the first notch;
cutting the base substrate to obtain an independent display substrate, wherein a cutting line of the cutting passes through the first notch, so that in the independent display substrate, a side edge of the first notch away from the display region overlaps with the edge of the base substrate;
an outer side edge of the covering layer is basically flush with the edge of the base substrate; and
wherein the first insulation layer on the base substrate further comprises at least one second notch in the first peripheral region, and the at least one second notch is on a side of the first notch close to the display region and at least partially parallel to the first notch, and the first notch and the at least one second notch are provided at intervals; and
the orthographic projection of the covering layer on the base substrate does not overlap with an orthographic projection of the at least one second notch on the base substrate.

18. The manufacturing method of the display substrate according to claim 17, wherein forming the first insulation layer comprises:
coating a first insulation material layer on the base substrate; and
performing a patterning process on the first insulation material layer to form the first insulation layer comprising the first notch;
wherein performing the patterning process on the first insulation material layer comprises:
coating a photoresist film on the first insulation material layer;
exposing and developing the photoresist film to form a photoresist pattern, wherein the photoresist pattern exposes at least a part of the side edge of the first insulation layer; and
etching a portion, which is exposed, of the first insulation material layer to form the first notch.

* * * * *